United States Patent [19]

Tanaka et al.

[11] Patent Number: 5,158,100

[45] Date of Patent: Oct. 27, 1992

[54] WAFER CLEANING METHOD AND APPARATUS THEREFOR

[75] Inventors: Masato Tanaka; Hisao Nishizawa; Nobuyuki Hirai; Kaoru Shinbara; Hitoshi Yoshioka, all of Hikone, Japan

[73] Assignee: Dainippon Screen Mfg. Co., Ltd., Japan

[21] Appl. No.: 518,971

[22] Filed: May 4, 1990

[30] Foreign Application Priority Data

May 6, 1989 [JP] Japan .............................. 1-113922
Mar. 30, 1990 [JP] Japan .............................. 2-87068
Apr. 7, 1990 [JP] Japan .............................. 2-92472

[51] Int. Cl.⁵ .............................................. B08B 3/10
[52] U.S. Cl. ...................................... 134/105; 134/108; 134/902
[58] Field of Search .............. 134/107, 108, 902, 105, 134/12; 68/18 C, 18 R; 202/170; 34/73, 78; 432/171

[56] References Cited

U.S. PATENT DOCUMENTS

| | | | |
|---|---|---|---|
| 2,366,949 | 1/1945 | Woppman et al. | 134/105 |
| 3,113,046 | 12/1963 | Reddick et al. | 134/108 |
| 3,308,839 | 3/1967 | Barday | 134/108 |
| 3,406,697 | 10/1968 | Mitchell et al. | 134/902 X |
| 4,156,621 | 5/1979 | Andrews et al. | 134/108 |
| 4,315,042 | 2/1982 | Spigarelli | 134/902 X |
| 4,693,777 | 9/1987 | Hazano et al. | 134/105 X |
| 4,838,476 | 6/1989 | Rahn | 134/902 |

FOREIGN PATENT DOCUMENTS 59-36240 9/1984 Japan ................................. 134/105

Primary Examiner—Frankie L. Stinson
Attorney, Agent, or Firm—Ostrolenk, Faber, Gerb & Soffen

[57] ABSTRACT

A wafer cleaning method and apparatus in which a cleaning solution is caused to evaporate at a temperature below its boiling point, and cleaning vapor thus produced is applied at a temperature above its dew point to a wafer such as a semiconductor wafer. The wafer is cleaned without formation of colloidal silica in the absence of aerosol, or etched uniformly free of impurities. The wafer cleaning apparatus comprises a cleaning solution storage, a vapor generating section, a wafer supporting position of a wafer supporting device and a vapor supply section. These components are arranged in a housing to overlap one another in plan view and to lie vertically close to one another. The apparatus has a compact overall construction with simplified seals for preventing leakage of the cleaning vapor.

5 Claims, 11 Drawing Sheets

WAFER CLEANING METHOD AND APPARATUS THEREFOR

BACKGROUND OF THE INVENTION (1) Field of the Invention

The present invention relates to wafer cleaning methods and apparatus for etching, and dissolving and removing metallic impurities from various types of wafers such as semiconductor substrates, glass substrates for photomasks and glass substrates for liquid crystal displays.

(2) Description of the Prior Art

Japanese Patent Publication Laying-Open No. 173720/1987 discloses such a cleaning technique, which comprises the steps of (1) placing a wafer in a treating chamber, (2) supplying vapor of hydrofluoric acid $HF/H_2O$ into the treating chamber to dissolve and wash oxide films off a wafer surface, (3) stopping the supply of hydrofluoric acid vapor after completion of oxide film removal and supplying high purity water vapor into the treating chamber to wash off hydrofluoric acid adhering to the wafer surface and inside walls of the treating chamber, and (4) stopping the supply of water vapor after hydrofluoric acid is sufficiently replaced by water, and supplying hot nitrogen gas $N_2$ into the treating chamber to dry the wafer.

As methods of producing vapor of hydrofluoric acid from a tank storing a hydrofluoric acid solution, the above publication discloses (a) heating of the tank, (b) injection of nitrogen gas into the solution to cause its bubbling, and (c) use of an ultrasonic generator.

Further, according to this known technique, a wafer supporting device is mounted in a housing, with the tank disposed at a lower lateral position of the housing for storing hydrofluoric acid acting as cleaning liquid. The tank and housing communicate with each other through a pipe including a valve. Hydrofluoric acid vapor is generated as noted above, which is supplied into the housing to dissolve and wash oxide films off the wafer surface.

Japanese Patent Publication Laying-Open No. 213127/1987 discloses a different cleaning technique. This technique is carried out by (1) supplying clean nitrogen gas $N_2$ into a treating chamber while spinning a wafer placed in the treating chamber, (2) in parallel with the above, supplying hydrogen fluoride gas HF, which is obtained by heating anhydrous hydrofluoric acid, and spraying superpure water into the treating chamber at the same time to produce hydrofluoric acid for removing oxide films from the wafer, (3) cleaning the wafer surface with jets of superpure water, and (4) spinning the wafer rapidly while introducing nitrogen gas to extract the liquid from and dry the wafer.

In both of the techniques disclosed in Patent Publications Laying-Open Nos. 173720/1987 and 213127/1987, the wafer before being dried is washed by supplying highly pure water vapor to the wafer surface and chamber walls or by spraying superpure water against the wafer. These techniques, however, have the drawback of leaving particles on the wafer surface in spite of the washing treatment.

In the technique disclosed in Patent Publication Laying-Open No. 173720/1987, an aerosol (mist) is formed along with the vapor by any one of the methods (a)–(c) of producing hydrofluoric acid vapor. That is, an aerosol is formed by boiling in the case of method (a), by formation of bubbles in method (b), and by cavitation in method (c).

Moreover, a space must be secured outside the housing to install the tank for storing hydrofluoric acid. This results in the disadvantage of enlarging the entire apparatus.

With such a wafer cleaning apparatus, it is necessary to prevent leakage of the vapor such as of hydrofluoric acid used in the cleaning treatment. Thus, seals must be provided not only for the housing but for the tank itself and connections of the pipe to the tank and housing. Such sealing structures are large and expensive.

In the technique disclosed in Patent Publication Laying-Open No. 213127/1987, the supply of superpure water and the direct supply to the wafer of the liquid hydrofluoric acid formed by dissolving hydrogen fluoride gas in the superpure water themselves result in adhesion of an aerosol to the wafer.

SUMMARY OF THE INVENTION

An object of the present invention is to provide a method capable of cleaning wafers with high precision whereby the wafers are cleaned to a particle-free condition.

Another object of the invention is to provide an apparatus effective for practicing the above wafer cleaning method. Specifically, the invention intends to provide a cleaning treatment in which a wafer surface is cleaned with cleaning vapor while avoiding formation of colloidal silica at and adjacent the gas/liquid and gas/solid interfaces, and to provide a cleaning treatment accompanied by an etching process in which a wafer is uniformly etched in the absence of impurities which is made possible by eliminating the aerosol.

A further object of the present invention is to provide a compact cleaning apparatus with simplified seals for preventing leakage of cleaning vapor.

Other objects and advantages of the present invention will be apparent from the following description.

In order to achieve the above objects, the present invention provides a method of cleaning a wafer by supplying cleaning vapor to the wafer, comprising the steps of causing a solution to evaporate at a temperature below a boiling point to produce the cleaning vapor, and supplying the cleaning vapor to the wafer at a temperature above a dew point thereof to clean the wafer.

The wafer cleaning method of this invention includes a cleaning method in which, as will be described later, a cleaning treatment is not carried out with a cleaning solution. This is because the wafer quality is not affected by omitting a cleaning treatment with a cleaning solution in the absence of particles and metallic impurities from the wafer having undergone a plurality of treatments preceding a cleaning treatment with cleaning vapor. Such instances include the case where, in causing growth of a synthetic film or a natural oxide film, the core pipe of an oxidizing furnace, wafer pallets, piping for the treating gas and the like are formed of materials having no impurities, and the treating gas used has a high degree of purity on the order of nine 9s after the decimal point (purity of 99.999999999), and the case where, for a cleaning process preceding the growth of such synthetic or natural oxide film, transport mechanisms, a chamber and the like are formed of materials having no impurities, the treating gas used has a high degree of purity, and the wafer is passed to the next process in a cleanroom under the atmospheric condition of a highly pure inert gas.

In the wafer cleaning method using a cleaning solution, and in the wafer cleaning apparatus, which will be described later, the wafer is cleaned with a cleaning solution in a chamber separate from a chamber in which a vapor cleaning treatment is provided. However, the invention includes a wafer cleaning method in which the wafer is cleaned with cleaning vapor and with a cleaning solution in the same chamber. This single-chamber cleaning treatment is made possible without forming colloidal silica by cleaning the wafer with cleaning vapor, thereafter replacing the vapor in the chamber with a dry inert gas and cleaning the wafer with a cleaning solution in the dry atmosphere containing no aerosol.

Experiments have been conducted for arriving at the present invention, by way of researches on the cause of particle formation. Particulars of these experiments, a review and a summary will be set out hereinafter.

EXPERIMENTS (A) Several droplets of a 25% aqueous solution of hydrofluoric acid were applied to a silicon wafer surface carrying 5,000 A of a thermal oxidation film of silicon (th-$SiO_2$). The way in which the thermal oxidation film was etched was observed through an optical microscope (see FIG. 4). The etching reaction of the thermal oxidation film progressed vertically and horizontally with respect to the silicon wafer. The vertical reaction is understood mainly as;

$$6HF + SiO_2 \rightarrow H_2SiF_6 + 2H_2O \quad (1)$$

$H_2SiF_6$ is hexafluorosilicic acid. Formation of bubbles was not detected.

Hydrofluoric acid spread fast horizontally. The horizontal etching reaction was such that surface areas of the thermal oxidation film around the droplets of hydrofluoric acid were first corroded into scale-like forms by mixed vapor $HF/H_2$ generating from the droplets. This reaction is as follows:

$$SiO_2 + 4HF + 2H_2O \rightarrow SiF_4 + 4H_2O \quad (2)$$

where $SiF_4$ is silicon tetrafluoride (gas).

Hydrofluoric acid spreading horizontally causes vertical etching as expressed by the formula (1).

(B) Next, droplets of hydrofluoric acid were separately applied to a bare silicon surface revealed after the thermal oxidation film of silicon has been etched away completely by the mixed vapor $HF/H_2O$. Changes taking place moment after moment were observed through the optical microscope (see FIG. 5).

The droplets became semispherical since the bare silicon surface completely stripped of the thermal oxidation film was hydrophobic. After a while, colloidal silica $SiO_2.nH_2O$ (a silicon oxide in colloids) was gradually deposited on gas/liquid and gas/solid interfaces around the droplets.

The droplets gradually diminished while colloidal silica was deposited increasingly around the droplets. Meanwhile, relatively large colloidal particles were found afloat in the droplets.

Colloidal silica was in fine grain sizes up to about 0.625 μm. Aggregates of colloidal silica deposited formed spots known as blue hazes on the bare silicon surface. The deposition of colloidal silica was not limited to the gas/liquid and gas/solid interfaces but occurred on areas of the bare silicon surface surrounding the droplets as well. When a droplet having a diameter d was put on the silicon wafer, colloidal silica was rapidly deposited on the gas/solid interface over a range around the droplet about 4 times its diameter as shown in FIG. 5.

Colloidal silica was formed also on the droplet surface, i.e. the gas/liquid interface.

The incidence rate of colloidal silica was highest at both gas/solid and gas/liquid interfaces and became progressively lower farther away therefrom.

The reason for the formation of colloidal silica at the gas/solid interface shown in FIG. 5 is not clear. It appears, however, that colloidal silica was formed as a result of bonding between the moisture evaporating from the droplet surface and silicon tetrafluoride in the atmosphere.

As the droplet gradually diminished, colloidal silica was deposited in a certain amount around the droplet. When the droplet disappeared in the end, large colloidal particles which had been afloat in the droplet remained around what had been the center of the droplet. However, when the droplet was caused to evaporate at an increased rate, colloidal silica was deposited ultimately only around the peripheries, with no colloidal silica left in the center (see FIG. 6).

Such formation of colloidal silica was limited to areas contacting the atmosphere of the etching treatment, and did not take place in the wet areas covered by the droplets, i.e. at the liquid/solid interface.

(C) An experiment was conducted to check on the relationship to a rinsing treatment with deionized water (pure water).

Droplets of pure water were applied to a bare silicon surface after the natural oxide film was removed with hydrofluoric acid, and results were observed through the microscope. Colloidal silica was formed around the droplets applied to the bare silicon surface immediately after removal of the natural oxide film. However, colloidal silica was hardly formed on a bare silicon surface rinsed after removal of the natural oxide film.

Activating energy of the silicon surface is believed to lessen as a result of bonding between the silicon surface and various substances such as carbon present in the air.

Thus, colloidal silica can be formed during the period following removal of the natural oxide film by mixed vapor $HF/H_2O$ and before the bare silicon surface is covered by pure water, which presumably results in particles.

REVIEW

Colloidal silica is formed on portions of the bare silicon surface exposed to the atmosphere after being etched with hydrofluoric acid. Further, it has been found that colloidal silica is formed around the droplets and its incidence rate tends to lessen away from the gas/liquid and gas/solid interfaces. This shows that the formation of colloidal silica is closely related to the amount of moisture in the atmosphere. Colloidal silica is $SiO_2.nH_2O$ which appears to be formed, if at all, when silicon tetrafluoride $SiF_4$ (gas) formed by the treatment with hydrofluoric acid reacts with moisture in the atmosphere as in the following formula (3):

$$3SiF_4 + 3H_2O \rightarrow SiO_2 \cdot H_2O + 2H_2SiF_6 \quad (3)$$

In other words, the formation of colloidal silica is considered due to hydrolysis of silicon tetrafluoride $SiF_4$ (gas).

Silicon tetrafluoride may be formed by the reaction expressed by formula (2), as a result of corrosion of the bare silicon by vapor HF evaporating from the droplets of hydrofluoric acid, or as a result of decomposition of hexafluorosilicic acid in the droplets as $H_2SiF_6 \rightarrow SiF_4 + 2H_2O$. This silicon tetrafluoride and water vapor are considered to cause the hydrolysis expressed by formula (3) to produce and deposit colloidal silica. Another possible cause of colloidal silica formation is the silicon dissolved in hydrofluoric acid as expressed by the following formula:

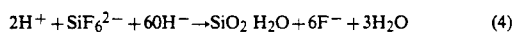

$$2H^+ + SiF_6^{2-} + 6OH^- \rightarrow SiO_2\,H_2O + 6F^- + 3H_2O \qquad (4)$$

However, the above reaction takes place only at the gas/liquid interface and does not extend to regions around the droplets.

It appears, therefore, that the deposition of colloidal silica is promoted mainly by the hydrolytic effect of atmospheric moisture upon silicon tetrafluoride which results from etching of the silicon surface by hydrogen fluoride.

Colloidal silica is also fostered by the droplets adhering to the bare silicon surface stripped of the natural oxide film. Thus, mist or aerosol adhering to the surface will act as the core for promoting formation of colloidal silica.

SUMMARY (a) The deposition of colloidal silica is promoted by the hydrolytic effect of atmospheric moisture upon silicon tetrafluoride resulting from etching of the silicon surface by hydrogen fluoride.

(b) Colloidal silica is deposited around the droplets adhering to the bare silicon surface stripped of the natural oxide film.

(c) No deposition of colloidal silica is found in the droplet-covered portions.

(d) Colloidal silica is deposited after the natural oxide film is etched away by hydrofluoric acid and the bare silicon surface becomes hydrophobic, particularly during the period following exposure of the bare silicon surface to the atmosphere until the bare silicon surface is covered by deionized water.

(e) The incidence rate of colloidal silica is highest at the gas/liquid and gas/solid interfaces and becomes progressively lower farther away therefrom.

(f) Colloidal silica is not formed on the bare silicon wafer surface in an active state especially where etching and rinsing treatments are carried out successively and the bare silicon surface is isolated from the atmosphere.

(g) Sizes of colloidal silica are on the order of 0.625 μm and its aggregates look like hazy spots to the naked eye.

It will be understood from the foregoing observations that, in order to prevent formation of colloidal silica, an attempt should be made to allow no aerosol (mist) to exit in the atmosphere for the cleaning process. For this purpose, it is important not to supply an aerosol to the silicon wafer and not to allow the cleaning vapor supplied to the silicon wafer to liquefy and form an aerosol.

These facts have been found through the experiments, and measures as set out hereunder have been taken on the basis of such findings to solve the problem.

The following cleaning liquids or solutions are available for use in the present invention:

[1] Sulfuric acid ($H_2SO_4$), a mixture of sulfuric acid and hydrogen peroxide ($H_2O_2$), fuming sulfuric acid ($H_2SO_4 + SO_3 + H_2O_2$), and an aqueous solution of sulfuric acid:

Vapors from these liquids are effective for eliminating organic and inorganic substances. An aqueous solution of sulfuric acid ($H_2SO_4 + H_2O$) having an azeotropic composition at 98.4% and a boiling point at 317° C. reacts with metallic impurities to form a sulfate, thereby dissolving and removing the metallic impurities.

[2] Nitric acid ($HNO_3$), fuming nitric acid ($HNO_3 + NO_2 + H_2O$) containing nitric acid in a concentration of at least 86%, and an aqueous solution of nitric acid:

Vapors from these liquids react with metallic impurities to form nitrides, thereby dissolving and removing the metallic impurities. However, aluminum (Al), chromium (Cr) and iron (Fe) become passive. The silicon surface may be oxidized.

[3] A liquid mixture and an aqueous solution of nitric acid ($HNO_3$) and hydrogen halides (HF, HCl, etc.):

Vapors from these liquids react with metallic impurities for their dissolution and removal. Further, particles and metallic impurities are removable by a combination of oxidation by nitric acid and oxide decomposition by hydrogen halides.

[4] An aqueous solution of hydrogen fluoride (hydrofluoric acid) ($HF + H_2O$), and a liquid mixture and an aqueous solution of hydrogen fluoride (HF) and alcohol (ROH):

Vapors from these liquids are effective for etching and removal of natural oxide films ($SiO_x$), and react with metallic impurities to form fluorides for dissolution and removal thereof.

[5] a liquid mixture and an aqueous solution of hydrogen fluoride (HF) and hydrogen peroxide ($H_2O_2$), and an liquid mixture and an aqueous solution of hydrogen fluoride (HF), alcohol (ROH) and hydrogen peroxide ($H_2O_2$):

Vapors from these liquids are capable of removing particles and metallic impurities with oxidation by hydrogen peroxide of the silicon surface and decomposition by hydrogen fluoride of the oxides taking place simultaneously.

[6] An aqueous solution of hydrogen chloride (hydrochloric acid) ($HCl + H_2O$), a liquid mixture and an aqueous solution of hydrogen chloride (HCl) and alcohol (ROH), a liquid mixture and an aqueous solution of hydrogen chloride (HCl) and hydrogen peroxide ($H_2O_2$), and a liquid mixture and an aqueous solution of hydrogen chloride (HCl), alcohol (ROH) and hydrogen peroxide ($H_2O_2$):

Vapors from these liquids react with metallic impurities and remove them in the form of chlorides.

[7] An aqueous solution of ammonia ($NH_3 + H_2O$), and a liquid mixture and an aqueous solution of ammonia ($NH_3$) and alcohol (ROH):

Vapors from these liquids are capable of removing particles by utilizing that ammonia dissolves silicon compounds (i.e. etch silicon) to a minor extent.

[8] A liquid mixture and an aqueous solution of ammonia ($NH_3$) and hydrogen peroxide ($H_2O_2$), and a liquid mixture and an aqueous solution of ammonia ($NH_3$), alcohol (ROH) and hydrogen peroxide ($H_2O_2$):

Vapors from these liquids remove particles with etching of silicon by ammonia and oxidation by hydrogen peroxide. The wafer surface becomes oxidized and hydrophilic after the treatment.

[9] Choline ($[(CH_3)_3NC_2H_4OH]OH$) and choline derivatives ($[(C_nH_{2n+1})_4N]OH$), an aqueous solution of choline ($[(CH_3)_3NC_2H_4OH]OH+H_2O$), and a liquid mixture and an aqueous solution of choline ($[(CH_3)_3NC_2H_4OH]OH$) and alcohol (ROH):

Vapors from these liquids remove particles with etching of silicon by choline.

[10] A liquid mixture and an aqueous solution of choline ($[(CH_3)_3NC_2H_4OH]OH$) and hydrogen peroxide ($H_2O_2$), and a liquid mixture and an aqueous solution of choline ($[(CH_3)_3NC_2H_4OH]OH$), alcohol (ROH) and hydrogen peroxide ($H_2O_2$):

Vapors from these liquids remove particles with etching of silicon by choline and oxidation by hydrogen peroxide. The wafer surface becomes oxidized and hydrophilic after the treatment.

According to the wafer cleaning method of the present invention, the cleaning vapor to be supplied to the wafer is produced by evaporating a cleaning solution at a temperature below its boiling point. In other words, the cleaning vapor is produced, without boiling the cleaning solution, by evaporating the solution from its surface in a molecular diffusive fashion tending to a balanced mass transfer at the gas/liquid interface. The cleaning treatment is carried out with such cleaning vapor at an atmospheric temperature above the dew point of the cleaning vapor, i.e. under the condition in which the saturation vapor pressure of the cleaning vapor exceeds its partial pressure, in order to avoid formation of an aerosol due to condensation of the cleaning vapor. This precludes the cause of formation of colloidal silica. Formation of an aerosol is prevented by producing the cleaning vapor at a temperature below the boiling point of the solution and maintaining the so produced vapor at a temperature above its dew point. This protects the wafer surface from contamination by impurities, formation of particles, adhesion of particles carried by an aerosol, and uneven etching results.

Thus, the vapor for cleaning the wafer is obtained in an aerosol-free state by evaporating the cleaning solution at a temperature below the boiling point. Moreover, the cleaning vapor is supplied to the wafer at a temperature above the dew point without allowing it to liquefy. This feature precludes the cause of colloidal silica formation due to an aerosol, thereby allowing an effective cleaning treatment with the cleaning vapor to provide the wafer with a clean surface. Where an etching process is included in the treatment, the wafer may be etched uniformly in the absence of impurities.

It is important to exclude an aerosol (mist) for prevention of colloidal silica. Water vapor itself is a gas and its presence will present no problem.

The present invention provides a wafer cleaning apparatus having a wafer supporting device for supporting a wafer under treatment, which is suited for practicing the above wafer cleaning method. This apparatus comprises a cleaning solution storage for storing a cleaning solution, a vapor generating section defined above the cleaning solution storage for evaporating the cleaning solution at a temperature below a boiling point thereof, and a vapor supply section for supplying cleaning vapor to the wafer supported by the wafer supporting device while adjusting the cleaning vapor to a temperature above a dew point thereof. The cleaning solution storage, vapor generating section, a wafer supporting position of the wafer supporting device and the vapor supply section are arranged in a housing to overlap one another in plan view and to lie vertically close to one another.

Preferably, at least the wafer supporting position of the wafer supporting device and the vapor supply section are enclosed in a double, inner and outer housing structure, and an exhaust control device is provided for controlling displacements such that a greater amount of gas is exhausted from an inner housing than from a space between the inner housing and an outer housing.

According to the wafer cleaning apparatus of this invention, the cleaning solution storage, vapor generating section, the wafer supporting position of the wafer supporting device and the vapor supply section are arranged in a housing to vertically overlap one another within a limited range. The housing may be sealed to prevent leakage of the cleaning vapor from the range from cleaning solution storage to vapor supply section.

The entire apparatus is formed compact since the cleaning solution storage, vapor generating section, the wafer supporting position of the wafer supporting device and the vapor supply section are arranged in a housing to vertically overlap one another within a limited range.

The seals applied to the housing alone are used to prevent leakage of the cleaning vapor from the range from cleaning solution storage to vapor supply section. Such construction can dispense with a special sealing arrangement as provided in the prior art where the cleaning solution storage for generating the cleaning vapor is disposed outside the housing. The simplified seals against vapor leakage as in the present invention have an advantage of economy.

With the wafer cleaning apparatus including the exhaust control device, the cleaning vapor having been supplied to the wafer is prevented from leakage by the double housing construction. In addition, controls are provided to exhaust a greater amount of gas from the inner housing than from the space between the inner and outer housings. The pressure within the inner housing thereby becomes lower than that of the space between the two housings, which results in suction of the gas from outside to inside of the inner housing to promote prevention of the cleaning vapor leaking outwardly of the apparatus.

Thus, since the wafer supporting position of the wafer supporting device and the vapor supply section are enclosed in the double housing structure, the cleaning vapor supplied to the wafer is effectively prevented from leaking outwardly.

Further, because of the difference in displacement for lowering the pressure inside the inner housing below the pressure in the space between the two housings, the outgoing cleaning vapor will not flow from the inner housing into the space between the two housings. This feature assures prevention of outward leakage of the cleaning vapor exhaust.

The foregoing wafer cleaning method may be made even more effective by transporting the cleaned wafer to a wet cleaning chamber where the wafer is cleaned with a further cleaning solution.

The cleaning solution or liquid used in the wet cleaning chamber is not limited to pure water (deionized water) but may be selected from ammonium hydrogen peroxide, hydrochloric hydrogen peroxide, choline and choline derivatives. The wafer may be or may not be spun during the cleaning treatment in the wet cleaning chamber.

According to this modified cleaning method, the cleaning solution used in the wet cleaning chamber will never mix into the cleaning vapor since the wafer having been cleaned with the cleaning vapor is transferred to the wet cleaning chamber. Further, formation of colloidal silica is prevented by the feature that the cleaning solution, which is not supplied in mist form to the wafer, entirely covers the wafer surface having been cleaned with the cleaning vapor.

Since the wafer, which has been cleaned with the cleaning vapor containing no aerosol, is transferred to the wet cleaning chamber to be cleaned with the cleaning solution, the cleaning solution will never mix into the cleaning vapor and colloidal silica formation due to the treatment with the cleaning solution is avoided. A clean-surfaced wafer may be obtained also where the wafer is cleaned in a series of treatments with the cleaning vapor and cleaning solution. Where an etching process is involved, the wafer may be etched uniformly in the absence of impurities. Thus, even where particles remain after the vapor cleaning treatment, such particles may be removed.

The modified cleaning method as noted above may be carried out effectively by a wafer cleaning apparatus according to the present invention which comprises a vapor generating section for evaporating a cleaning solution at a temperature below a boiling point thereof, a dry cleaning chamber including a temperature controlling device for adjusting cleaning vapor supplied from the vapor generating section to a temperature above a dew point thereof, the dry cleaning chamber being operable to clean the wafer as placed therein with the cleaning vapor having the adjusted temperature, a wafer transport mechanism for transporting the wafer after being cleaned from the dry cleaning chamber, and a wet cleaning chamber separated from the dry cleaning chamber and including a device for supplying a further cleaning solution, the wet cleaning chamber receiving the wafer transported by the wafer transport mechanism to clean the wafer by supplying the further cleaning solution thereto.

According to this wafer cleaning apparatus, the cleaning vapor is produced in the vapor generating section by evaporating the cleaning solution at a temperature below its boiling point. In other words, the cleaning vapor is produced, without boiling the cleaning solution, by evaporating the solution from its surface in a molecular diffusive fashion tending to a balanced mass transfer at the gas/liquid interface. The dry cleaning chamber includes a temperature controlling device for maintaining the cleaning vapor to a temperature above its dew point to prevent the vapor from liquefying into an aerosol within the dry cleaning chamber. In addition, the dry cleaning chamber is separated from the wet cleaning chamber to preclude the possibility that the cleaning solution used in the wet cleaning chamber will mix into the cleaning vapor in the dry cleaning chamber. Thus, the cleaning treatment is carried out with the cleaning vapor in an aerosol-free condition, thereby preventing formation of colloidal silica.

When the wafer as cleaned above is removed from the dry cleaning chamber by the wafer transport mechanism, chemicals such as silicon tetrafluoride which may cause formation of colloidal silica just leave the wafer surface instead of remaining thereon. Once the wafer is removed from the dry cleaning chamber, there will no longer be a contact with silicon tetrafluoride. The wafer is now exposed to air in the cleanroom which has a high degree of purity and contains no aerosol. Thus, formation of colloidal silica is prevented at this stage as well. In the wet cleaning chamber the wafer is cleaned as entirely covered by the cleaning solution, which is also effective to prevent formation of colloidal silica.

Thus, the cleaning vapor formed in the vapor generating section contains no aerosol, and is maintained at a temperature above the dew point by the temperature controlling device. The dry cleaning chamber is separated from the wet cleaning chamber to preclude the possibility of the cleaning solution mixing into the cleaning vapor in the dry cleaning chamber. Consequently, the wafer is cleaned with the cleaning vapor in an aerosol-free condition.

In the wet cleaning chamber the wafer is cleaned as entirely covered by the cleaning solution to prevent formation of colloidal silica.

All these features combine to realize a cleaning apparatus effective for successively cleaning the wafer with the cleaning vapor and with the cleaning solution without forming colloidal silica.

BRIEF DESCRIPTION OF THE DRAWINGS

FIG. 3 is a sectional view of a wafer cleaning apparatus in a second embodiment of the invention, FIGS. 4 through 8 relate to the experiments conducted by Inventors, in which:

DESCRIPTION OF THE PREFERRED EMBODIMENTS

Embodiments of the present invention will be described in detail hereinafter with reference to the drawings.

FIRST EMBODIMENT

Figure 1:
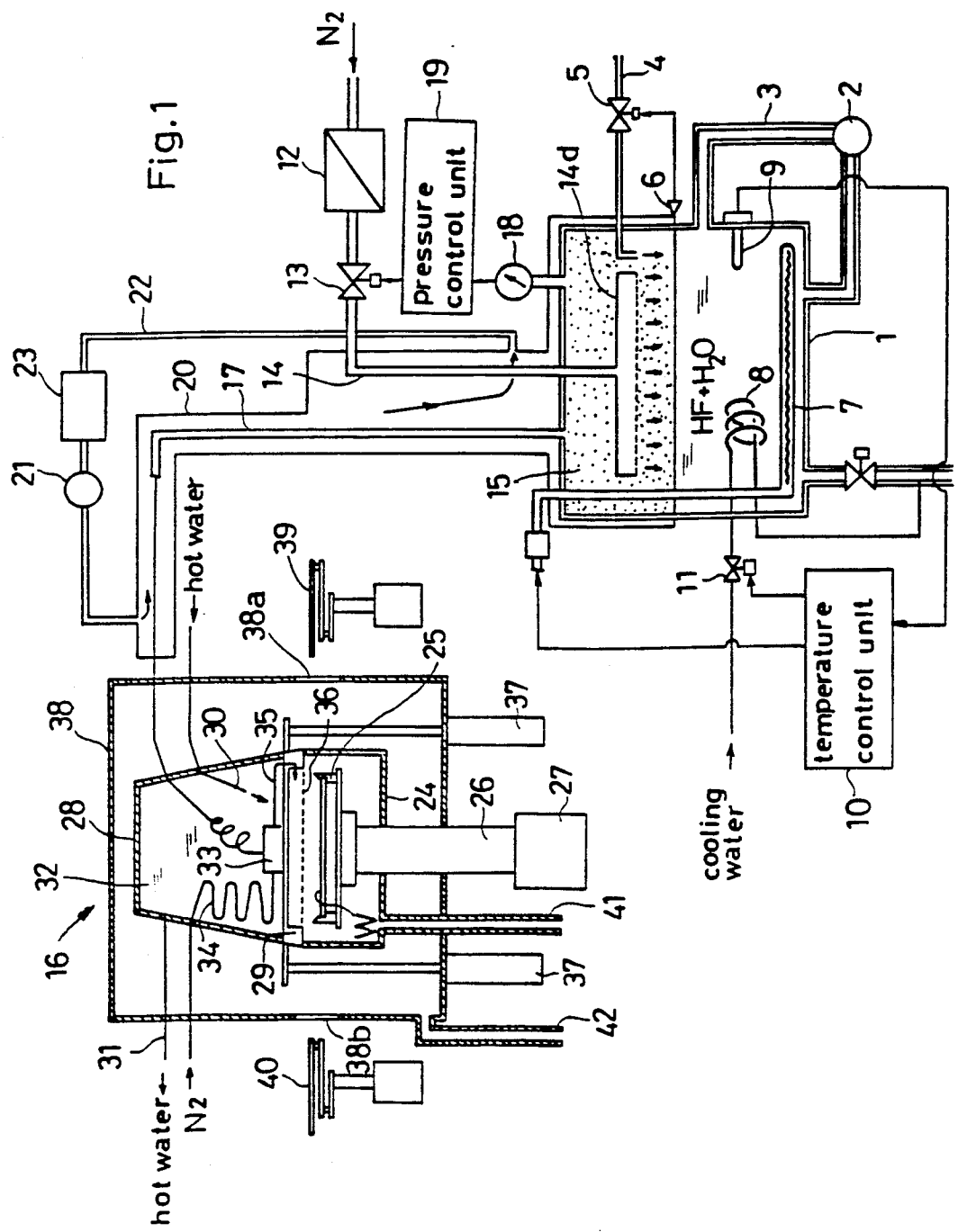
FIG. 1 is a sectional view of a wafer cleaning apparatus in a first embodiment of the present invention.

FIG. 1 is a sectional view of a wafer cleaning apparatus in a first embodiment of the invention. Reference numeral 1 denotes a storage tank for storing a liquid mixture of hydrofluoric acid HF and pure water $H_2O$, i.e. a cleaning solution in a quasiazeotropic state to be described later, quasiazeotropy being detailed in Japanese Patent Application Serial No. 1-109292 (corresponding to U.S. Patent Application filed Apr. 20, 1990. A pipe 3 including anagitating pump 2 is connected to a bottom position and a lateral position of the storage tank 1.

A cleaning solution supply pipe 4 is connected to the storage tank 1. This supply pipe 4 extends from a different tank (not shown) for storing the cleaning solution in the azeotropic state (manufactured by Morita Kagaku Kogyo Co., Ltd.). The supply pipe 4 has a switch valve 5 which is opened to replenish the storage tank 1 when a storage level of the cleaning solution falls below a position detected by a liquid level gauge 6.

The storage tank 1 accommodates a heater 7 for heating the cleaning solution, a cooling pipe 8 for cooling the solution, and a temperature sensor 9 for measuring temperature of the solution stored in the tank 1. The temperature sensor 9 is connected to a temperature control unit 10 to which an electromagnetic valve 11 mounted on the cooling pipe 8 and the heater 7 are also connected.

While the agitating pump 2 acts to uniform the temperature of the cleaning solution stored, the temperature control unit 10 controls the heater 7 and electromagnetic valve 11 in response to the temperature detected by the temperature sensor 9. As a result, the cleaning solution stored in the tank 1 is maintained at 30° C. which is an azeotropic temperature to be described later (which temperature corresponds to an azeotropic concentration of 39% at 760 mmHg as described later).

More particularly, when the temperature of the cleaning solution falls as a result of replenishment, for example, the heater 7 is driven to heat the solution in the storage tank 1 up to the azeotropic temperature of 30° C. Conversely, when the temperature of the solution exceeds this azeotropic temperature, the electromagnetic valve 11 is opened to cause cooling water to flow through the cooling pipe 8 for lowering the solution temperature.

These controls maintain the cleaning solution, which is a liquid mixture of hydrofluoric acid and pure water, at the azeotropic temperature to cause evaporation below a boiling point.

Further, a nitrogen gas supply pipe 14 is connected to the storage tank 1 for supplying nitrogen gas $N_2$ acting as a carrier. This supply pipe 14 includes a flow controller 12 and an electromagnetic valve 13, with a nozzle 14a having a porous plate attached to an extreme end of the pipe 14 located inside the storage tank 1. Thus, an upper, vapor generating region 15 of the tank 1 has a uniform pressure distribution.

A vapor supply pipe 17 is connected to the storage tank 1 for transmitting cleaning vapor diluted with the carrier nitrogen gas $N_2$ from the vapor generating region 15 to a dry cleaning chamber 16.

The storage tank 1 has a pressure sensor 18 for measuring pressure of the atmosphere including the cleaning vapor in the vapor generating region 15. The pressure sensor 18 is connected to a pressure control unit 19 which is connected to the electromagnetic valve 13 on the nitrogen gas supply pipe 14. The pressure control unit 19 operates the electromagnetic valve 13 in response to the pressure measured by the pressure sensor 18, thereby to control the nitrogen gas supply for maintaining the atmosphere in the vapor generating region 15 at the ambient pressure of 760 mmHg.

A forward portion of the nitrogen gas supply pipe 14, the vapor generating region 15 of storage tank 1 and vapor supply pipe 17 are enclosed in an outer pipe 20 formed of a heat insulating material. The outer pipe 20 contains hot water, and a bypass pipe 22 having a pump 21 extends between an upstream position and a downstream position of the outer pipe 20. The bypass pipe 22 includes a heater 23 mounted in an intermediate position thereof.

This construction recirculates hot water heated by the heater 23 to an appropriate temperature (50° C., for example). As a result, the vapor of the cleaning solution which comprises a vaporous mixture of hydrogen fluoride gas HF and pure water vapor $H_2O$ and which flows from the vapor generating region 15 into the vapor supply pipe 17 is maintained at a temperature above the dew point. In the cleaning vapor, hydrogen fluoride gas is maintained at the azeotropic concentration of 39.4% under the conditions of 760 mmHg and 30° C.

That is, as detailed in Japanese Patent Application No. 1-09292 (corresponding to U.S. Patent Application filed Apr. 20, 1990), the saturated vapor pressures of the cleaning vapor in the atmosphere and each component of the vapor are maintained above their respective partial pressures to prevent condensation or liquefaction of the cleaning vapor and components thereof.

At this time, the sum (PHF+PH2O) of the partial pressures of hydrogen fluoride gas and pure water vapor is 18 mmHg, and the partial pressure of nitrogen gas is 742 mmHG.

Figure 11:
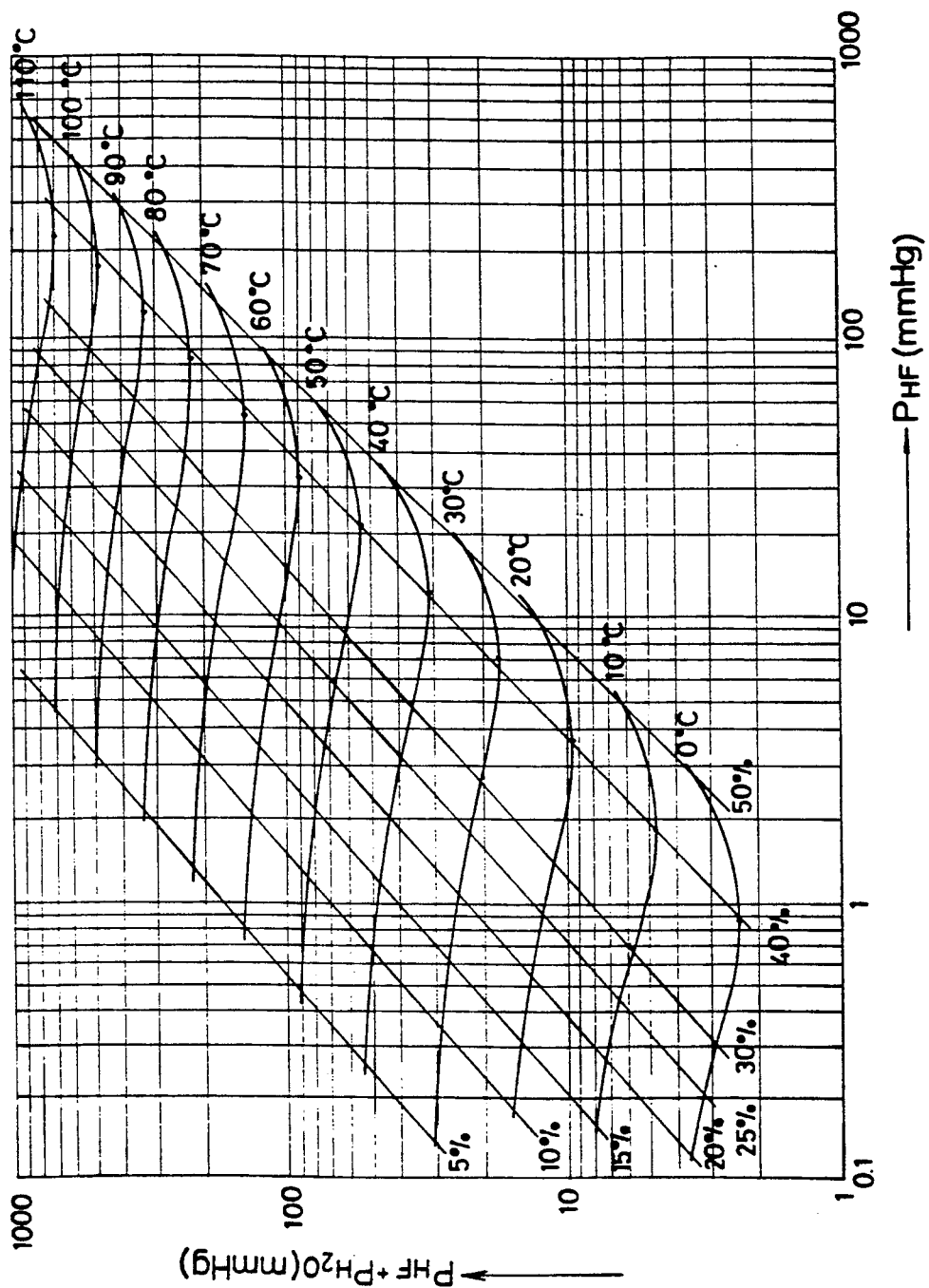
FIG. 11 is a graph showing vapor pressures of a mixture of hydrogen fluoride HF and water $H_2O$.

FIG. 11 is a graph showing vapor pressures of the liquid mixture of hydrogen fluoride HF and water $H_2O$. The horizontal axis represents partial pressure PHF of fluoric hydride, while the vertical axis represents the total pressure, i.e. the sum (PHF+PH2O) of partial pressure PHF of hydrogen fluoride and partial pressure PH2O of water vapor. The relations between partial pressure PHF and total pressure PHF+PH2O are shown by using temperature T as a parameter.

The oblique straight lines indicate composition ratios (molar fractions) of hydrogen fluoride with respect to the entire liquid mixture.

According to this graph, the vaporous mixture of hydrogen fluoride gas and pure water vapor does not become condensed or liquefied if the vapor produced at the azeotropic temperature of 30° C. under the foregoing conditions is maintained at temperatures above 30° C. On the other hand, the vaporous mixture of hydrogen fluoride gas and pure water vapor becomes liquefied if the temperature of the vapor having the total pressure of 760 mmHg, with the mixed gas of hydrogen fluoride gas and pure water vapor at the 18 mmHg partial pressure and nitrogen gas at the 742 mmHg partial pressure, falls below 30° C. when hydrogen fluoride is at the azeotropic concentration of 39.4% described later.

No aerosol is included in such cleaning vapor composed of hydrogen fluoride gas and pure water vapor. This cleaning water is generated in the vapor generating region 15 by a vapor generator which comprises the construction including the heater 7, cooling pipe 8, temperature sensor 9, temperature control unit 10 and electromagnetic valve 11 for maintaining the temperature of the cleaning solution at 30° C., and the construction including the electromagnetic valve 13, nitrogen gas supply pipe 14, pressure sensor 18 and pressure control unit 19 for maintaining the atmospheric pressure in the storage tank 1 at 760 mmHg.

Pseudo-azeotrope will now be described.

Figure 2:
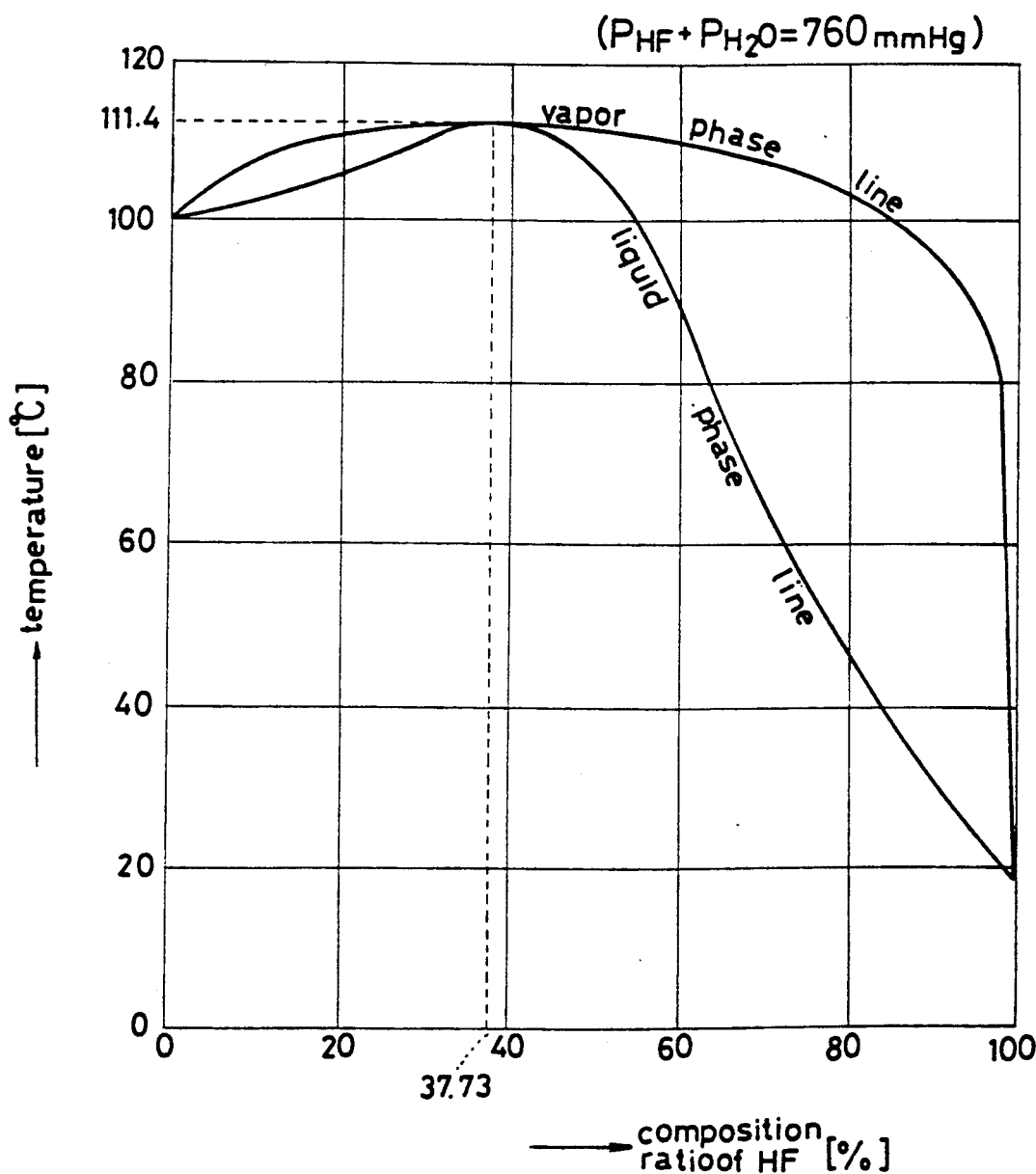
FIG. 2 is a graph of composition-to-temperature characteristic curves, which characteristics appear under ambient pressure.

FIG. 2 shows composition-to-temperature characteristics occurring when the total pressure PHF+PH2O of partial pressure PHF of hydrogen fluoride HF and partial pressure PH2O of water H2O is 760 mmHg. The horizontal axis represents composition ratio or concentration (%) of hydrogen fluoride, and the vertical axis represents temperature (° C.).

In FIG. 2, the liquid phase curve and vapor phase curve of the liquid mixture of hydrogen fluoride and water at 760 mmHg meet at 111.4° C. This is an azeotropic point at which the concentration of hydrogen fluoride is 37.73%.

Azeotropic conditions are satisfied where the storage tank 1 stores a cleaning solution composed of hydrogen fluoride having the 37.73% concentration and pure water in 62.27% (=100−37.73%), the atmospheric pressure in the storage tank 1 is maintained at 760 mmHg and the temperature of the cleaning solution at 111.4° C. Then, the cleaning vapor has the same composition ratio HF:H2O=37.73:62.27 as the cleaning solution, and this ratio is invariable all the time even if the cleaning solution diminishes with progress of its evaporation.

However, the temperature of 111.4° C. is rather high and, to promote safety, the cleaning solution should preferably be caused to evaporate at a lower temperature. Where, for example, the evaporation temperature of 30° C. is desired, the azeotropic conditions are met by the pressure PHF+PH2O at 18 mmHg and the concentration of hydrogen fluoride acid HF at 39.4%. A pressure reduction is required to set the atmospheric gas pressure PHF+PH2O to 18 mmHg. It is quasi-azeotrope that eliminates the need for the pressure reduction and allows evaporation to take place in the atmosphere at 760 mmHg ambient pressure.

Thus, the cleaning solution comprising a mixture of hydrogen fluoride in 39.4% and pure water in 60.6% is supplied into the storage tank 1. The temperature of the cleaning solution is maintained at 30° C. by temperature adjustment effected through the heater 7, cooling pipe 8, temperature sensor 9 and temperature control unit 10.

The cleaning solution evaporates under the 760 mmHg atmospheric pressure in the storage tank 1, which is the total of partial pressures PHF, PH2O and PN2 of hydrogen fluoride gas, water vapor and nitrogen gas. When the atmospheric pressure deviates from 760 mmHg, pressure adjustment is effected through the pressure sensor 18, electromagnetic valve 13 and pressure control unit 19 to maintain the pressure at 760 mmHg.

Nitrogen gas having a partial pressure of 742 mmHg (=760−18 mmHg) is supplied through the nitrogen gas supply pipe 14 into the storage tank 1 to act as an atmospheric and carrier gas.

The cleaning solution in this case has a composition ratio HF:H2O=39.4:60.6. On the other hand, the atmospheric gas has a composition ratio calculated as;

HF:H2O:N2=5.21:8.00:86.79.

(The above proportional expression is based on HF+H2O+N2=100. If based on HF+H2O+N2=760, the expression reads HF:H2O:N2=7.09:10.91:742.) This composition ratio differs from that of the cleaning solution.

However, what is important to the wafer cleaning treatment is not the composition ratio of the entire atmospheric gas but the composition ratio between hydrogen fluoride gas and water vapor, which is;

HF:H2O=5.21:8.00=39.4:60.6.

(When based on HF+H2O+N2=760 also, the expression reads HF:H2O=7.09:10.91=39.4:60.6.) This agrees with the composition ratio of the cleaning solution, which means quasi-azeotrope.

Consequently, the cleaning vapor supplied to the dry cleaning chamber 16 to be described next has a composition ratio maintained constant all the time. Besides, the cleaning vapor can be generated at ambient pressure and at a temperature as low as 30° C., which promotes safety and requires no pressure reduction.

What is more important to the present invention is that the cleaning solution is allowed to evaporate at a temperature below the boiling point. This feature has the advantage of producing no aerosol since the cleaning solution evaporates from its surface without being boiled.

The construction of dry cleaning chamber 16 will be described next.

A wafer treating chamber 24 in the form of a bottomed cylinder houses a mechanical chuck 25 rotatable on a horizontal plane with a semiconductor or other wafer W mounted thereon. The chuck for supporting the wafer W may comprise a known vacuum suction chuck instead of the mechanical chuck. It may include a heater therein for heating the wafer W as sucked by a vacuum to a predetermined temperature. The mechanical chuck 25 has a rotary shaft 26 operatively connected to an electric motor 27, so that the wafer W placed on the chuck 25 is spun on a vertical axis.

The wafer treating chamber 24 has a top opening closed by a cup-shaped cover 28 including a tapered peripheral wall, a chamber 29 integral and watertight with a lower end of the peripheral wall, and a top board integral and watertight with an upper end of the peripheral wall. A hot water supply tube 30 and a hot water drain tube 31 extend into the cover 28 through the peripheral wall to constantly maintain hot water of a fixed temperature (e.g. 50° C.) in the cover 28. Thus, the cover 28 defines a thermostatic hot water tank 32 for maintaining the interior of the cover 28 at the fixed temperature.

The thermostatic hot water tank 32 accommodates an aspirator 33 to which are connected the vapor supply pipe 17 for supplying the cleaning vapor composed of hydrogen fluoride gas, water vapor and nitrogen gas for etching and cleaning the wafer W, a carrier gas supply tube 34 for supplying nitrogen gas acting as carrier gas, and a vapor supply tube 35 for supplying the cleaning vapor to the chamber 29. The cleaning vapor diluted with the carrier gas is supplied into the chamber 29 as drawn by a negative pressure produced by flows of the carrier gas.

The vapor supply pipe 17, aspirator 33 and vapor supply tube 35 are placed in the thermostatic hot water tank 32 in order to control the temperature of the cleaning vapor to be above the dew point for prevention of its liquefaction or formation of an aerosol. In this sense, the thermostatic hot water tank 32, and the combination of outer pipe 20, pump 21, bypass pipe 22 and heater 23 for effecting temperature control of the vapor supply pipe 17 adjacent the cleaning solution storage tank 1 constitute the temperature control means of this invention.

The chamber 29 includes a gas inlet at its peripheral wall position and at an angle (e.g. 30°) to the radial direction, and a porous plate 36 defining a vapor supply section over a lower opening area. The cleaning vapor flowing into the chamber 29 through the slant gas inlet forms a vortex in the chamber 29, with the amount of flow increasing from center to periphery because of the centrifugal force. Consequently, the amount of vapor flowing out through the porous plate 36 is the greater toward the peripheries when the mechanical chuck 25 stands still. The rotation of the chuck 25 for spinning the wafer W supported thereon generates horizontal vapor flows, producing a negative pressure around the center. This increases the amount of vapor flow through center regions of the porous plate. As a result, the cleaning vapor is equalized in flowing out through the entire porous plate 36 to be directed evenly over the surface of wafer W.

The cup-shaped cover 28 is vertically movable with the chamber 29 and, when in a lowered position, rests on a packing along an upper edge of the wafer treating chamber 24 to place the latter in a gastight condition. Air cylinders 37 are provided as a mechanism for raising and lowering the cover 28.

The wafer treating chamber 24, cup-shaped cover 28 and the like constitute a main treating assembly which defines a double chamber construction with an outer housing 38. The housing 38 includes a wafer inlet 38a and a wafer outlet 38b level with the mechanical chuck 25, which are opened and closed by shutters not shown, as disclosed in U.S. patent application Ser. No. 642,014.

Flexion arm type wafer transport mechanisms 39 and 40 are disposed outside the housing 38 adjacent the inlet 38a and outlet 38b, respectively. With the cover 28 raised to open the wafer treating chamber 24, the wafer W as suction-supported by the transport mechanism 39 is delivered through the inlet 38a into the housing 38 and placed on the chuck 23. The wafer W may be removed likewise from the chunk 23 and out of the housing 38 through the outlet 38b. Such wafer transport mechanisms are disclosed in Japanese Utility Model Publication Laying-Open No. 176548/1985 (U.S. patent application Ser. No. 462,014), for example.

Numeral 41 denotes an exhaust pipe connected to the treating chamber 24. Numeral 42 denotes an exhaust pipe connected to the housing 38.

The way in which the wafer cleaning apparatus operates will be described next.

In the dry cleaning chamber 16, hot water is supplied at the fixed temperature (50° C.) through the hot water supply tube 30. The hot water is cooled through a heat exchange and exhausted through the exhaust tube 31. Thus, the temperature in the thermostatic hot water tank 32 is maintained constant.

The wafer inlet 38a is opened, and the air cylinders 37 are extended to raise the cover 28 and secure a space between cover 28 and mechanical chunk 25 for entry of the wafer transport mechanism 39. Wafer W is placed on and held tight by vacuum suction to the transport mechanism 39, which is then extended to deliver the wafer W through the inlet 38a into the housing 38 and onto the mechanical chuck 25. Thereafter the transport mechanism 39 is flexed to retract through the inlet 38a, and the inlet 38a is closed.

The air cylinders 37 are contracted to lower the cover 28 into pressure contact with the wafer treating chamber 24 to close the latter. Next, the electric motor 27 is driven to spin the chuck 25 and wafer W together. The carrier gas is fed through the carrier gas supply tube 34 to the aspirator 33 to produce a negative pressure. As a result, the aspirator 33 draws in the cleaning vapor composed in the fixed ratio of hydrogen fluoride gas, pure water vapor and nitrogen gas and containing no aerosol in the quasiazeotropic state, from the vapor generating region 15 of the storage tank 1 through the vapor supply pipe 17. It will be understood that the cleaning vapor will nonetheless flow into the chamber 29 without using the aspirator 33.

At this time, the cleaning vapor flowing through the vapor supply pipe 17 is maintained at a predetermined temperature above its dew point, and thus prevented from liquefaction, by the hot water heated by the heater 23 and recirculated by the pump 21. When flowing through the forward portion of the vapor supply pipe 17, aspirator 33 and vapor supply tube 35, the cleaning vapor is prevented from liquefaction, hence producing no aerosol, by the hot water in the thermostatic hot water tank 32.

The cleaning vapor diluted with the carrier gas in the aspirator 33 is supplied to the chamber 29 through the vapor supply tube 35 and slant gas inlet.

The cleaning vapor jetting at an angle into the chamber 29 forms a vortex in the chamber 29, circulating in a progressively greater amount from center to periphery and passing through the porous plate 36 to be supplied to the wafer W. The centrifugal force generated by the spin of the wafer W supported on the chunk 25 produces radially outward vapor flows.

By suitably selecting a flow rate of the cleaning vapor supplied and a rotating rate of the chunk 25, balance may be obtained between the negative pressure resulting from the vapor flows under the centrifugal force and the vapor flows descending from the porous plate 36, whereby the wafer W is subjected to a uniform vapor flow. This allows the thermal oxidation film of silicon on the wafer W to be etched uniformly over the entire surface, resulting in a flat profile.

In addition, since the cleaning vapor containing no aerosol is suppled and the temperature control is provided in the course of vapor supply to prevent aerosol formation, the etching treatment may be carried out for the wafer W in the condition that precludes formation of colloidal silica.

Upon completion of a required etching process, the supply of cleaning vapor is stopped and the electric motor 27 is switched off. The interiors of wafer treating chamber 24 and housing 38 are purged through the exhaust pipes 41 and 42. Then the air cylinders 37 are extended to raise the cover 28 and open the treating chamber 24. The wafer outlet 38b is opened, and the wafer transport mechanism 40 is extended to pick up the wafer W and flexed to transport the wafer W outwardly through the outlet 38b. Finally, the outlet 38b is closed.

SECOND EMBODIMENT

Figure 3:
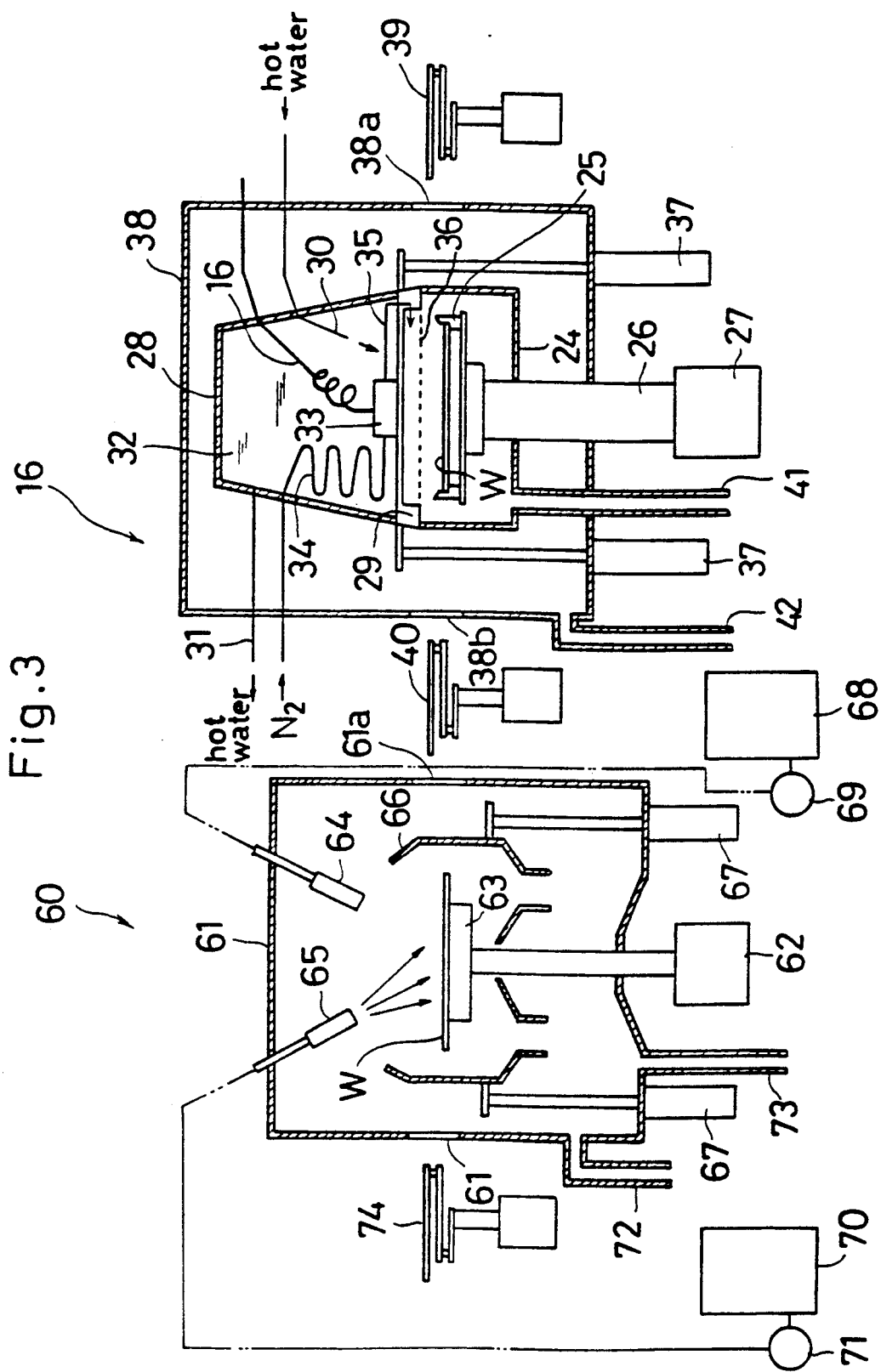
Figure 4:
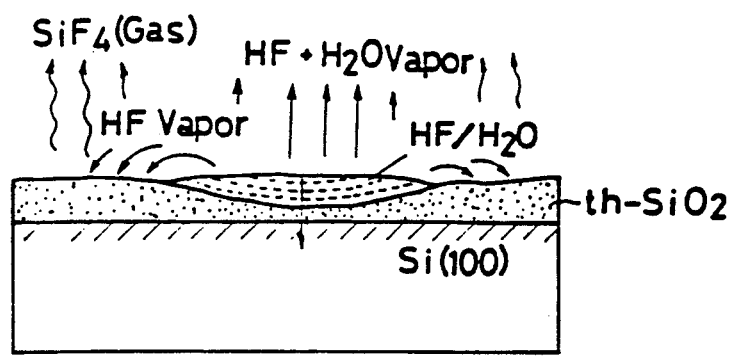
FIG. 4 is a sectional view showing the way in which a thermal oxidation layer is etched.
Figure 5:
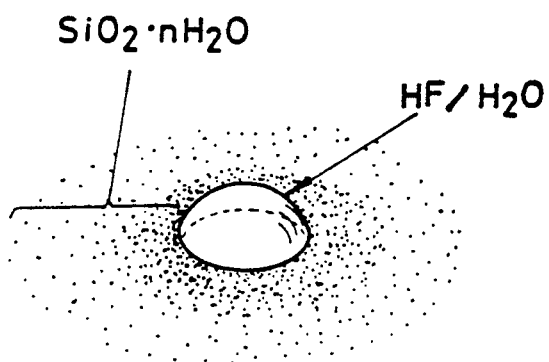
FIG. 5 is a perspective view showing the way in which colloidal silica is deposited around a droplet of water or other liquid on bare silicon.
Figure 6:
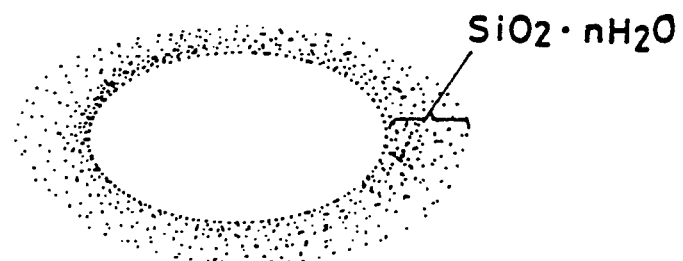
FIG. 6 is a perspective view showing colloidal silica remaining deposited after the droplet is evaporated.

FIG. 3 is a sectional view of a second embodiment which additionally comprises a wet cleaning chamber 60 disposed next to the dry cleaning chamber 16. The wafer W having been cleaned with the cleaning vapor is delivered to the wet cleaning chamber 60 by the wafer transport mechanism 40 for a cleaning treatment with a cleaning solution or cleaning liquids.

The dry cleaning chamber 16 is identical to that already described, and like reference numerals are affixed to like components without repeating the description.

The wet cleaning chamber 60 will be described hereinafter.

A cleaning tank 61 houses a spin chuck 63 driven by an electric motor 62, with the wafer W held thereon by suction. A nozzle 64 is provided for spraying pure water H₂O, and a nozzle 65 for spraying a cleaning chemical to the wafer W. The cleaning tank 61 further houses a cover 66 for preventing the water and chemical from scattering and for allowing smooth downflow thereof. The cover 66 is vertically movable by air cylinders 67 disposed under the cleaning tank 61. Elongate capillary nozzles, as disclosed in U.S. patent application Ser. No. 3983,408, consititue the nozzles 64 and 65, respectively.

The combination of nozzle 64 for spraying pure water and nozzle 65 for spraying the cleaning chemical to the wafer W corresponds to a cleaning solution supply mechanism.

Numeral 68 denotes a pure water storage tank, 69 a pump associated therewith, 70 a chemical storage tank, 71 a pump associated therewith, 72 an exhaust gas pipe, 73 an exhaust liquid pipe, and 74 a flexion arm type wafer transport mechanism. The cleaning solution used here comprise the mixture of pure water and the cleaning chemical. The cleaning chemical may be selected from ammonium hydrogen peroxide, hydrochloric hydrogen peroxide, choline and choline derivatives.

In the second embodiment, silicon tetrafluoride SiF₄ which causes formation of colloidal silica only volatilizes from the surfaces of etched wafer W during transfer of the wafer W from the dry cleaning chamber 16 to the wet cleaning chamber 60. Further, formation of colloidal silica is prevented since the wafer W is placed in a cleanroom having a high degree of cleanliness and containing no aerosol.

The dry cleaning chamber 16 is separated from the wet cleaning chamber 60, hence the cleaning liquids sprayed into the wet cleaning chamber 60 will never enter the wafer treating chamber 24 in the form of mist.

Consequently, excellent etching results are obtained with no particles remaining on the wafer W.

OPERATION

The way in which the wet cleaning chamber 60 in the second embodiment operates will be described next.

In the wet cleaning chamber 60, a wafer inlet 61a is opened with the cover 66 lowered by contracting the air cylinders 67. The wafer W having been cleaned with the cleaning vapor in the dry cleaning chamber 16 is transferred to the spin chunck 63 by the wafer transport mechanism 40. After the transport mechanism 40 is retracted, the inlet 61a is closed. The air cylinders 67 are extended to raise the cover 66, and then the pump 70 is driven to supply the cleaning chemical such as choline through the nozzle 65 to the wafer W for a primary cleaning treatment. Thereafter the pump 69 is driven to supply pure water through the nozzle 64 to the wafer W for a secondary cleaning treatment.

Since the nozzles 64 and 65 comprise elongate capillary nozzles, a bare silicon surface of the wafer W may be coated all over in one effort with the chemical and pure water, thereby preventing formation of colloidal silica.

The cover 66 has a smooth construction for promoting downflow of the cleaning liquids. This prevents droplets from remaining on the cover 66, and allows the cleaning liquids after use to be drained smoothly down the liquid exhaust pipe 73, thereby preventing the liquids from remaining in the cleaning tank 61. By enclosing the wafer W in the cover 66, the mist on inside walls of the cleaning tank 61 is prevented from adhering to the wafer W.

After a required cleaning treatment is completed, the interior of the cleaning tank 61 is purged through the exhaust gas pipe 72 and the spin chuck 63 is rotated at high speed to scatter the cleaning liquids off the wafer W and dry the wafer W.

After the drying process, the cover 66 is lowered and the cleaned wafer W is removed through a wafer outlet 61b by the transport mechanism 74.

Bacteria, a cause of particles, could be bred in pure water within the nozzle 64 and piping connected thereto during non-cleaning periods. It is therefore desirable to keep pure water flowing from the nozzle 64 all the time to avoid the breeding of bacteria.

In the second embodiment, the wafer W is cleaned and dried in the same treating chamber 60. However, a separate chamber may be provided exclusively for drying purposes.

Further, in the second embodiment, the wafer W is etched and cleaned in the separate treating chambers 16 and 60. However, etching and cleaning may be carried out in the same chamber as long as the wafer W is completely dried after the cleaning treatment. This is because colloidal silica is not formed if a perfectly dry condition is met in the etching treatment. It is, however, desirable to provide the separate chambers 16 and 60 since a long time is consumed to attain a perfectly dry condition.

The wet cleaning chamber 60 may be the type to immerse the wafer W in pure water instead of spraying pure water to the wafer W in the cleaning tank 61.

THIRD EMBODIMENT

Apart from the experiments described hereinbefore, Inventors have carried out further experiments to check how particles are formed by organic contamination. Results show that it is highly advantageous to eliminate any organic contamination beforehand for preventing formation of colloidal silica.

EXPERIMENT

Figure 7:
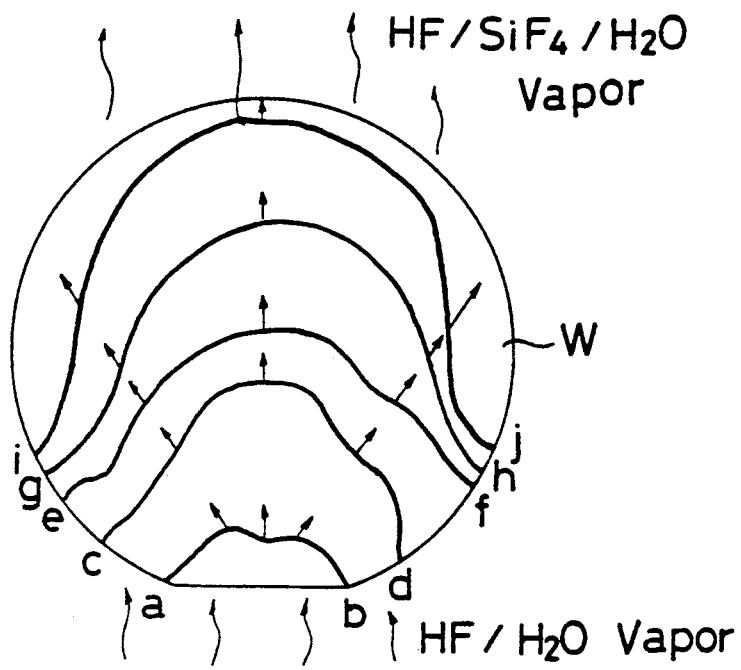
FIG. 7 is an explanatory view shoing the way in which etching progresses.
Figure 8:
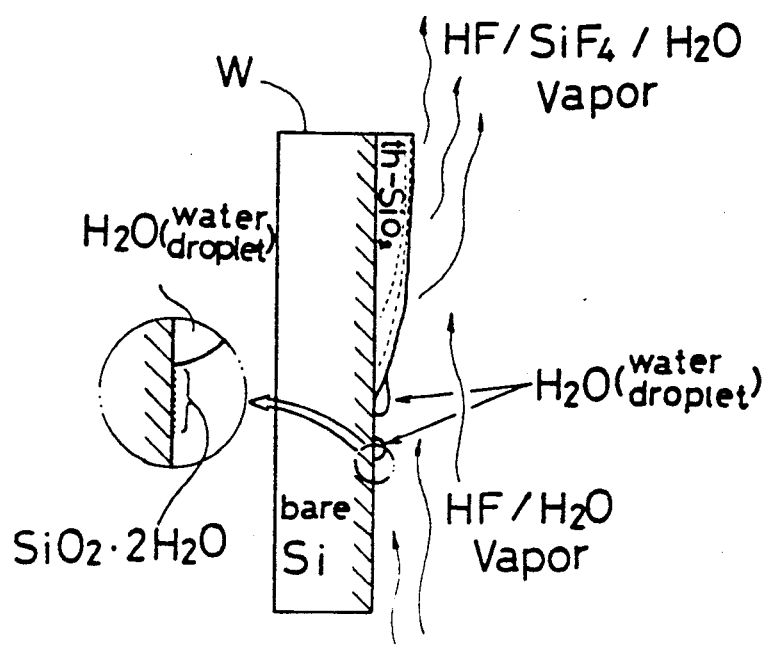
FIG. 8 is an explanatory view showing the way in which water droplets adhere to bare silicon.

As shown in FIG. 7, a silicon wafer W was set in a vertical posture and a vapor mixture of hydrogen fluoride and pure water was supplied upwardly to a surface of the wafer W. Then observation was made of etching of a thermal oxidation film of silicon th-SiO₂ on the wafer surface. Bare silicon Si was exposed from a lower position upward since the etching rate reduced from bottom to top. The boundary between bare silicon and thermal oxidation film shifted successively upward as a-b, c-d, e-f, g-h and i-j until finally the thermal oxidation film was eliminated. This reaction is expressed as follows:

$$6HF + SiO_2 \rightarrow H_2SiF_6 + 2H_2O \tag{5}$$

where $H_2SiF_6$ is hexafluorosilicic acid. Water was formed in the course of this reaction. As shown in FIG. 8, the water thus formed collects as droplets at the boundary between bare silicon Si and thermal oxidation film th-SiO₂, which move upward with progress of the etching.

When there was organic contamination on the surface of thermal oxidation film or when etching progressed in varied directions, part of the thermal oxidation film was left in the form of islands and water droplets remained on boundaries between such film islands and bare silicon.

The residual droplets contained hexafluorosilicic acid $H_2SiF_6$ and reacted as follows:

$$H_2SiF_6 \rightarrow SiF_4 + 2HF \quad (6)$$

$$3SiF_4 + 4H_2O \rightarrow SiO_2 \cdot 2H_2O + 2H_2SiF_6 \quad (7).$$

As a result, colloidal silica $SiO_2\ 2H_2O$ was formed on bare silicon around the droplets.

In order to prevent formation of colloidal silica, therefore, care must be taken for removal of organic contamination from the surface of thermal oxidation film and for fixing the etching direction.

In the first embodiment, the vapor mixture flows into the chamber 29 through the slant gas inlet, which results in influx through the porous plate 36 in the greater amount toward the peripheries. This is counterbalanced by the horizontal gas flows generated by spins of the wafer W supported on the mechanical chuck 25. With these horizontal gas flows, the atmospheric pressure becomes progressively higher away from the spin axis of the wafer. Consequently, the vapor flowing through the porous plate 36 is uniformly distributed over the entire surface of wafer W, thereby fixing the direction of etching progress. This leaves the question of organic contamination.

Figure 9:
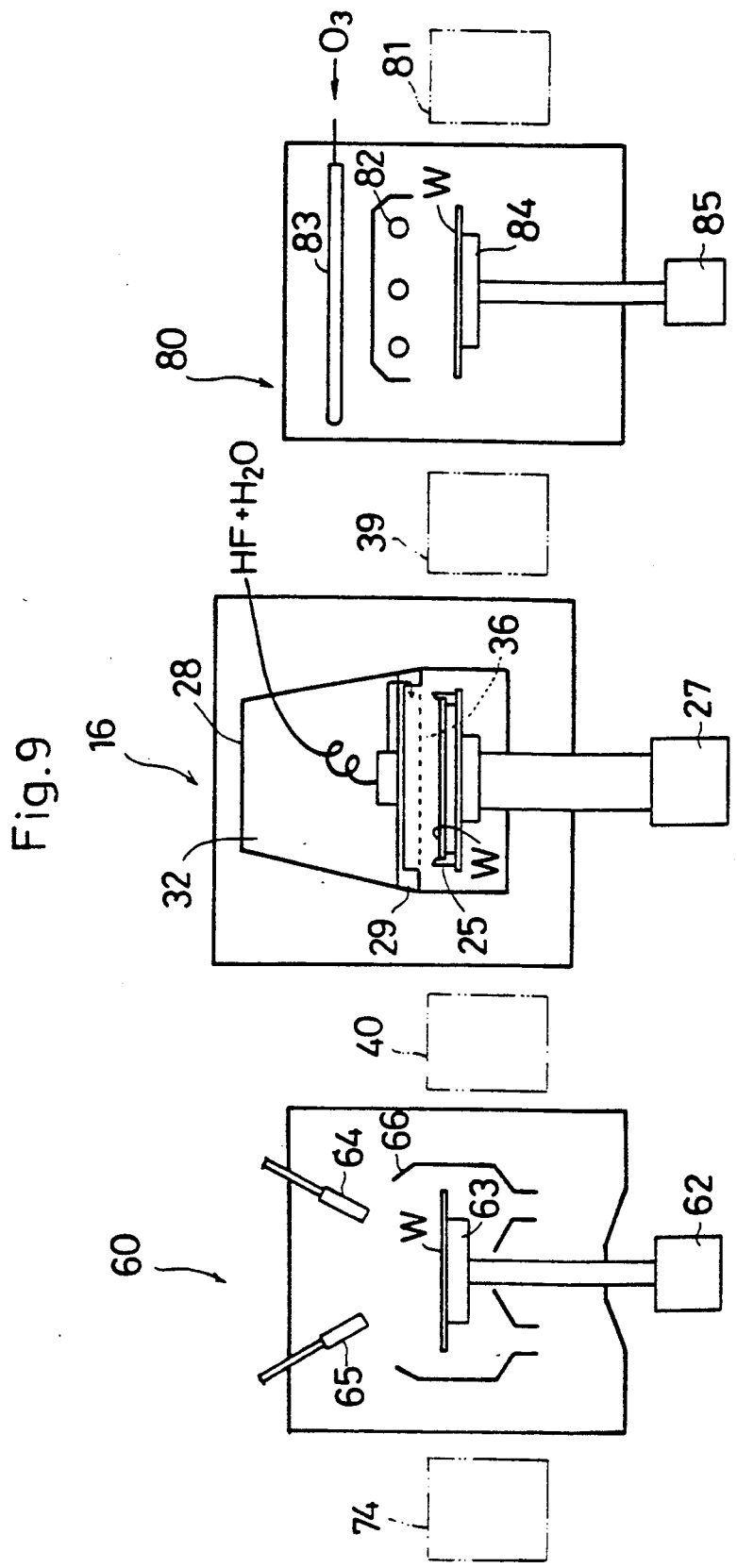
FIG. 9 is a schematic view of a wafer cleaning apparatus in a third embodiment of the invention.

A cleaning treatment using ultraviolet radiation and ozone supply is known to be effective for elimination of organic contamination. Having this fact in view, in the third embodiment, as shown in FIG. 9, an ultraviolet/ozone (UV/$O_3$) cleaning chamber 80 is provided opposite the dry cleaning chamber 16 of the first embodiment across the wafer transport mechanism 39. An additional wafer transport mechanism 81 is also provided to deliver wafer W into the ultraviolet/ozone cleaning chamber 80.

Numeral 82 denotes ultraviolet lamps acting as ultraviolet radiator means, 83 an ozone spray nozzle acting as ozone spray means, 84 a spin chuck acting as wafer support means, and 85 an electric motor.

In the other aspects of construction this embodiment is the same as the first and second embodiments.

Preparatory to the treatment in the dry cleaning chamber 16, organic contamination is eliminated from the wafer W in the ultraviolet/ozone cleaning chamber 80. This process prevents droplets from remaining in island forms on the bare silicon surface owing to organic contamination, thereby eliminating the possibility of formation of colloidal silica in the etching and cleaning treatments.

VARIATION

There will be described below a variation for the apparatus for producing and supplying the cleaning azeotropic mixture solution of hydrogen fluoride HF and pure water $H_2O$ mixed in the ratio of 37.73:62.27%, the apparatus being useful where the azeotropic mixture solution described previously is not available.

Figure 10:
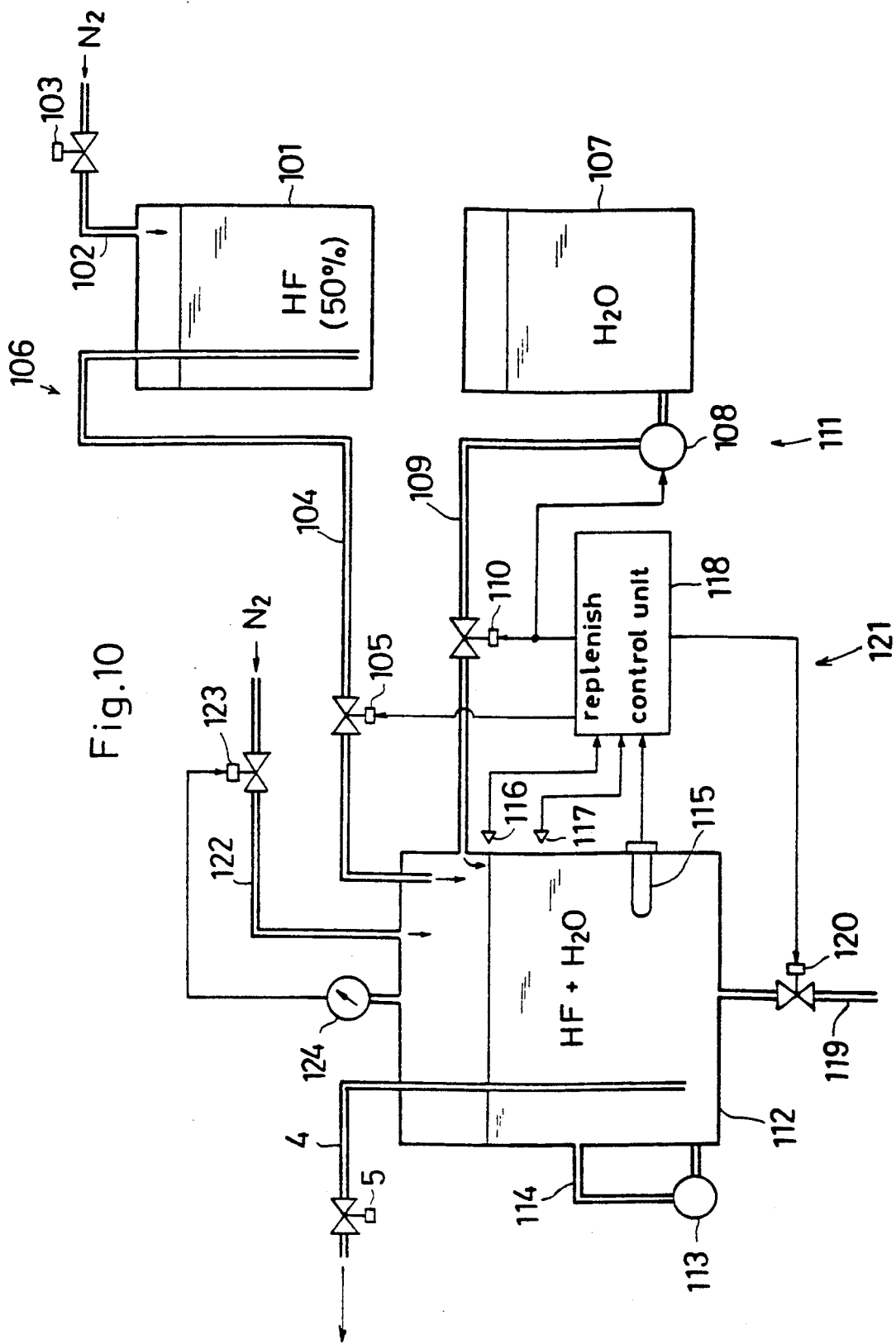
FIG. 10 is a schematic view of a wafer cleaning apparatus in a variation of the invention.

Referring to FIG. 10 which is a sectional view of the apparatus, a hydrofluoric acid supplying device 106 comprises a hydrofluoric acid storage tank 101 storing an aqueous solution about 50% in concentration of hydrofluoric acid which is commercially available and acts as hydrogen halide for use in the cleaning treatment, a nitrogen gas supply pipe 102 and a valve 103 for supplying nitrogen gas $N_2$ under pressure to force hydrofluoric acid out of the storage tank 101, a hydrofluoric acid supply pipe 104 for transmitting hydrofluoric acid, and an electromagnetic valve 105 mounted on the hydrofluoric acid supply pipe 104.

A pure water supplying device 111 comprises a pure water storage tank 107 storing pure water $H_2O$, a pump 108 for transmitting the pure water under pressure from the storage tank 107, a pure water supply pipe 109, and an electromagnetic valve 110 mounted on the pure water supply pipe 109.

The hydrofluoric acid supply pipe 104 and pure water supply pipe 109 are connected to a cleaning solution storage tank 112. The storage tank 112 receives hydrofluoric acid and pure water and stores the cleaning solution formed by mixing the two liquids.

Further, a bypass pipe 114 including an agitating pump 113 is connected to the cleaning solution storage tank 112 for agitating and mixing hydrofluoric acid and pure water therein.

The cleaning solution storage tank 112 includes a concentration sensor 115 such as a conductivity meter or an ultrasonic concentration meter for detecting concentration of the cleaning solution, an upper level sensor 116 and a lower level sensor 117. The concentration sensor 115, upper level sensor 116 and lower level sensors 117 are all connected to a replenish control unit 118. The replenish control unit 118 is connected to the electromagnetic valve 105 of hydrofluoric acid supply pipe 104, pump 108, electromagnetic valve 110 of pure water supply pipe 109 and to an electromagnetic valve 120 mounted on a drain pipe 119 of the cleaning solution storage tank 112. These components constitute a concentration controlling device 121 for replenishing the cleaning solution storage tank 112 with hydrofluoric acid and pure water under the control based on the concentration detected by the concentration sensor 115, thereby to maintain the cleaning solution stored in the storage tank 112 at the quasi-azeotropic concentration of 39.4% (this percentage being one example).

Specifically, the hydrofluoric acid storage tank 101 is pressurized by opening the electromagnetic valve 103 to supply nitrogen gas $N_2$ through the nitrogen gas supply pipe 102. At this time the electromagnetic valve 11 105 is opened to allow hydrofluoric acid to be supplied through the hydrofluoric acid supply pipe 104 to the cleaning solution storage tank 112. When hydrofluoric acid is filled up to the lower level sensor 117, the replenish control unit 118 closes the electromagnetic valve 105 to stop the supply of hydrofluoric acid, and opens the electromagnetic valve 110 and actuates the pump 108 to supply pure water from the pure water storage tank 107 through the supply pipe 108 to the cleaning solution storage tank 112.

At this time the agitating pump 113 is driven to mix hydrofluoric acid and pure water. When the concentration sensor 115 detects the quasi-azeotropic concentration of 39.4%, the replenish control unit 118 closes the electromagnetic valve 110 and stops the pump 108 to discontinue the supply of pure water.

If the upper level sensor 116 turns on before the concentration sensor 115 detects the quasi-azeotropic concentration of 39.4%, the electromagnetic drain valve 120 is opened to exhaust part of the cleaning solution, and pure water supplied until the cleaning solution comes to the quasi-azeotropic concentration of 39.4%.

The heat of dilution is generated when hydrofluoric acid and pure water are mixed in the cleaning solution storage tank 112. A certain fixed time is necessary for the heat of dilution to lose its influence and for the cleaning solution to attain a uniform concentration throughout. Upon lapse of the fixed time the conditions become stable and the cleaning solution is maintained at the quasi-azeotropic concentration of 39.4%.

The cleaning solution storage tank 112 is connected to the cleaning solution supply pipe 4 described in the first embodiment.

Further, a carrier gas supply pipe 122 is connected to the cleaning solution storage tank 112 for supplying nitrogen gas $N_2$ as carrier gas. This supply pipe 122 includes an electromagnetic valve 123. The cleaning solution storage tank 112 also includes a pressure sensor 124 for measuring pressure in an upper space thereof.

According to this construction, the electromagnetic valve 123 is opened to supply nitrogen gas $N_2$ as carrier gas through the supply pipe 122 into the cleaning solution storage tank 112. At this time the nitrogen gas is supplied under a fixed pressure by controlling the electromagnetic valve 123 based on the pressure detected by the pressure sensor 124.

FOURTH EMBODIMENT

Figure 12:
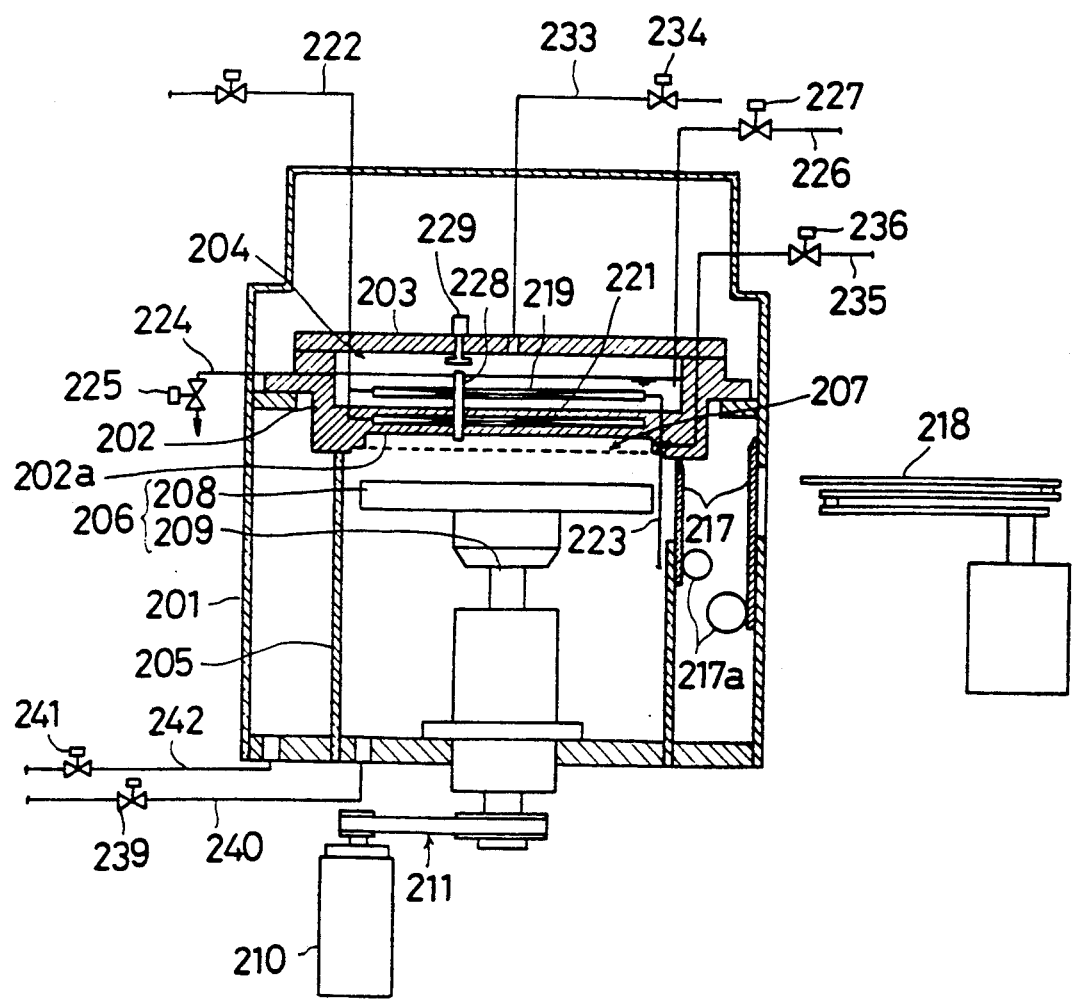
FIG. 12 is a schematic view in vertical section of a wafer cleaning apparatus in a fourth embodiment of the invention.

FIG. 12 is a schematic view in vertical section of a wafer cleaning apparatus in a fourth embodiment of the invention.

The fourth embodiment is an improvement on the dry cleaning chamber described in the preceding embodiments. A housing 201 contains a hydrofluoric acid tank 202 for storing hydrofluoric acid acting as a cleaning solution. The hydrofluoric acid tank 202 is closed by a top cover 203, and includes a vapor generating region 204 in an upper space thereof in which vapor is generated from hydrofluoric acid.

An inner housing 205 is provided inside the housing 201 and immediately under a bottom wall 202a of the hydrofluoric acid tank 202. The inner housing 205 accommodates a wafer supporting device 206 for supporting wafer W under treatment. A vapor supply section 207 is provided between the undersurface of the bottom wall 202a and wafer W for supplying the vapor of hydrofluoric acid.

Figure 13:
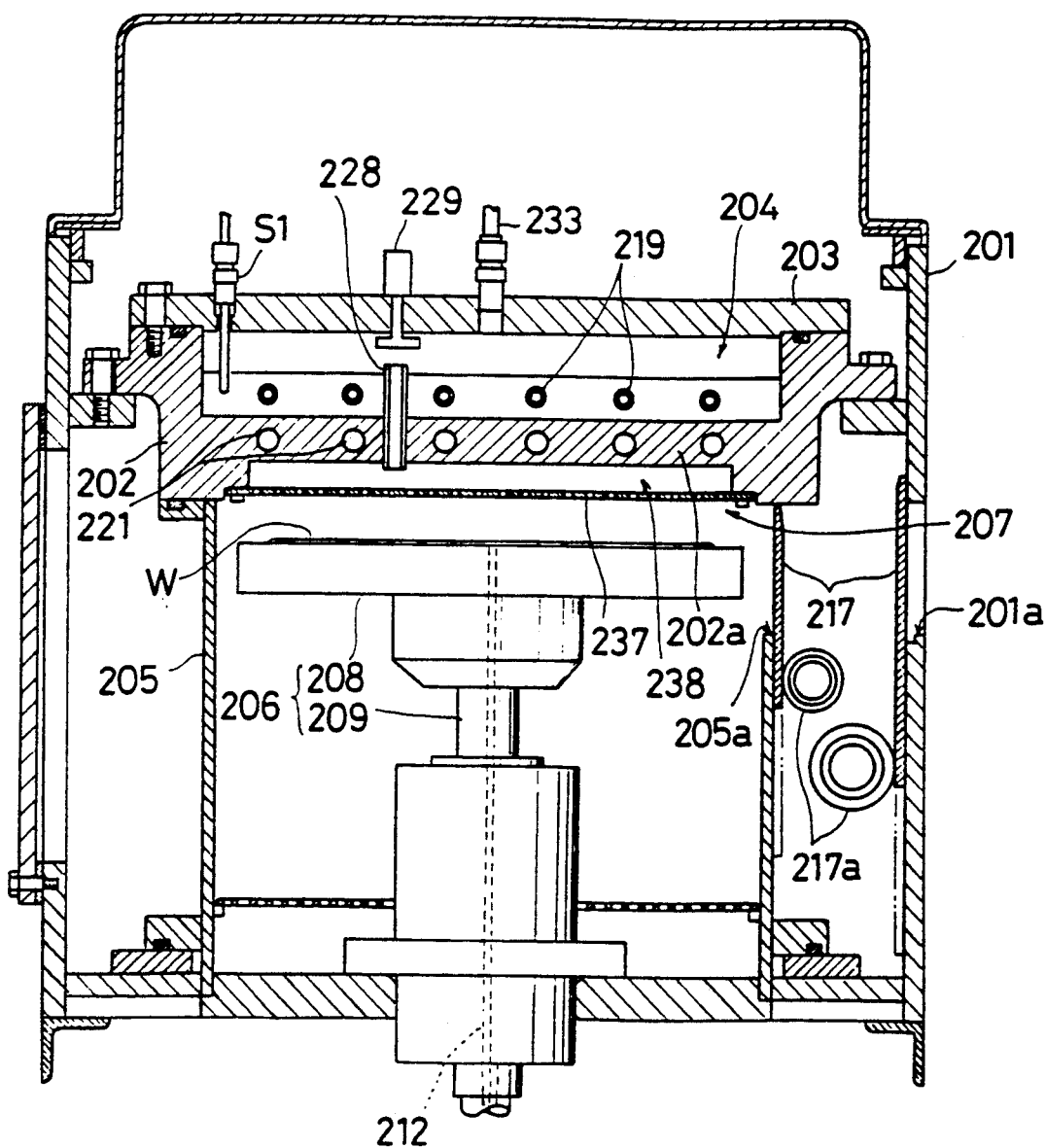
FIG. 13 is an enlarged sectional view of a principal portion of the apparatus shown in FIG. 12.

As shown in FIG. 13 which is an enlarged sectional view, the wafer supporting device 206 includes a hot plate 208 rotatable on a vertical axis and containing a heater (not shown), and a support shaft 209 rigidly connected to the hot plate 208. The support shaft 209 is operatively connected to an electric motor 210 outside the housing 201 through a belt transmission 211.

A vacuum suction passage 212 extends to the hot plate 208 through the support shaft 209 for maintaining the wafer in position by vacuum suction. The heater contained in the hot plate 208 is controlled by a temperature controller not shown to maintain a surface temperature of the hot plate 208 equal to or above the atmospheric temperature in the vapor supply section 207.

At a level substantially corresponding to the top surface of the hot plate 208, the inner housing 205 and housing 201 define openings 205a and 201a for allowing passage of the wafer W, respectively. Shutters 217 are provided for opening and closing the openings 205a and 201a. A flexion arm type wafer transport mechanism 218 disposed outside the opening 201a of the housing 201 is extendible to a position above the hot plate 208 for transporting the wafer W into and out of the inner housing 205. More particularly, the wafer W is delivered as suction-supported by the transport mechanism 218 through the openings 201a and 205a onto the hot plate 208. Thereafter the transport mechanism 218 is retracted outwardly of the housing 201, then the openings 201a and 205a are closed by shutters 217 and the wafer W is sucked to the hot plate 208. For removing the wafer W outwardly of the housing 201, the above sequence is reversed. That is, the shutters 217 are opened and the wafer W is carried by the transport mechanism 218 outwardly of the housing 201 through the openings 205a and 201a.

Each shutter 217 is movable between opening and closing positions by means of a rack (not shown) and a pinion (not shown), the latter being driven by an electric motor 217a. The shutters 217 may have any desired construction as long as they enable wafer transport and formation of a gastight space.

As shown in FIG. 13, the hydrofluoric acid tank 202 includes hot water piping 219 supported by a holder or holders not shown. The bottom wall 202a of the tank 202 defines a hot water passage 221 therein. Hot water is circulated through a loop made up of a hot water supply pipe 222 shown in FIG. 12, the piping 219, passage 221 and a hot water exhaust pipe 223. The hot water in circulation heats and evaporates hydrofluoric acid stored in the hydrofluoric acid tank 202. Thus, the hot water piping 219 and hot water passage 221 constitute heating means for heating and evaporating hydrofluoric acid. Reference S1 in FIG. 13 denotes a temperature sensor for measuring temperature of hydrofluoric acid in the hydrofluoric acid tank 202. The measured temperature is used to control the amount of hot water flowing through the piping 219 and passage 221, thereby maintaining the temperature of hydrofluoric acid below its boiling point.

When a cleaning solution having a low boiling point is employed, for example, the hot water piping 219 may be omitted, with the hot water passage 221 alone used to heat the cleaning solution. Further, oil may be used as a heating medium instead of hot water.

As shown in FIG. 12, the hydrofluoric acid tank 202 includes an overflow passage 224 having an automatic switch valve 224 mounted in an intermediate position thereof. Hydrofluoric acid having the concentration of 39.4% is supplied initially or as replenishment from a storage tank not shown through a supply pipe 226 until it overflows the tank 202. When an overflow occurs, a valve 227 is closed so that an appropriate amount of hydrofluoric acid is stored in the tank 202. A temperature controlling device may be provided for the hydrofluoric acid supply pipe 226 since it is desirable to preheat hydrofluoric acid supplied therethrough to a predetermined temperature. After the appropriate amount of hydrofluoric acid is stored, the automatic switch valve 225 is closed to prevent the hydrofluoric acid vapor from leaking through the overflow passage 224 during a cleaning treatment. Replenishment is made midway in the cleaning treatment with a suitable timing based on the number of wafers W processed an processing time. The construction for supplying the appropriate amount of hydrofluoric acid into the hydrofluoric acid tank 202 may, for example, include a liquid level gauge in the tank 202 for detecting a reduction to a predetermined amount, on the basis of which an appropriate amount of hydrofluoric acid is supplied.

A vapor supply passage 228 opens to communicate with the vapor generating region 204 at a position above an opening position of the overflow passage 224. An end of the vapor supply passage 224 opens through the bottom of the hydrofluoric acid tank 202 into the vapor supply section 207. A device 229 is provided for automatically opening and closing the vapor supply passage 228.

A carrier gas supply pipe 233 is connected to an upper position of the vapor generating region 204 for supplying nitrogen gas $N_2$ as a carrier gas. The carrier gas supply pipe 233 includes a valve 234. The carrier gas is used to feed, into the vapor supply passage 228, the hydrofluoric acid vapor collected in the vapor generating region 204 by heating.

A mixing gas supply pipe 235 is connected to the vapor supply section 207 for supplying nitrogen gas $N_2$ as a mixing gas. The mixing gas supply pipe 235 includes a valve 236.

Though not shown, each of the carrier gas supply pipe 233 and mixing gas supply pipe 235 has a temperature controlling device for maintaining nitrogen gas flowing therethrough to a predetermined temperature.

The vapor supply section 207 includes a vapor scattering porous plate 237 defining a vapor space 238 with the bottom wall 202a of the hydrofluoric acid tank 202. The vapor supply passage 228 communicates with the vapor space 238 for supplying the hydrofluoric acid vapor to the surface of wafer W on the hot plate 208. Hydrofluoric acid in the vapor supply section 207 is maintained at a temperature above its dew point by the heating action of the hot water passage 221 defined in the bottom wall 202a of hydrofluoric acid tank 202 and by the heat from the hot plate 208.

According to the described construction, the hydrofluoric acid tank 202, vapor generating region 204, vapor supply section 207, and vapor supply passage 228 intercommunicating the vapor generating region 204 and vapor supply section 207 are arranged vertically close to one another. These components may, therefore, be heated or temperature-controlled efficiently in a batched manner, to readily prevent condensation of the cleaning vapor flowing therein.

As shown in FIG. 12, a first exhaust pipe 240 having a first flow control valve 239 commmunicates with the interior space of inner housing 205. A second exhaust pipe 242 having a second flow control valve 241 communicates with the space defined between inner housing 205 and outer housing 201. The first and second exhaust pipes 240 and 242 are connected to respective suction devices not shown. The first flow control valve 239 has a larger opening degree than the second flow control valve 241, so that a greater amount of gas is exhausted from inside the inner housing 205 than from the space between the two housings 201 and 205. This exhaust control arrangement is effective for preventing the hydrofluoric acid vapor exhausted after being supplied to the wafer W from leaking outwardly of the apparatus.

In order to increase the displacement of inner housing 205 over that of outer housing 201, the exhaust pipe 240 may have a larger diameter than the exhaust pipe 242, with the two pipes 240 and 242 connected to a common suction device or separate suction devices.

FIFTH EMBODIMENT

Figure 14:
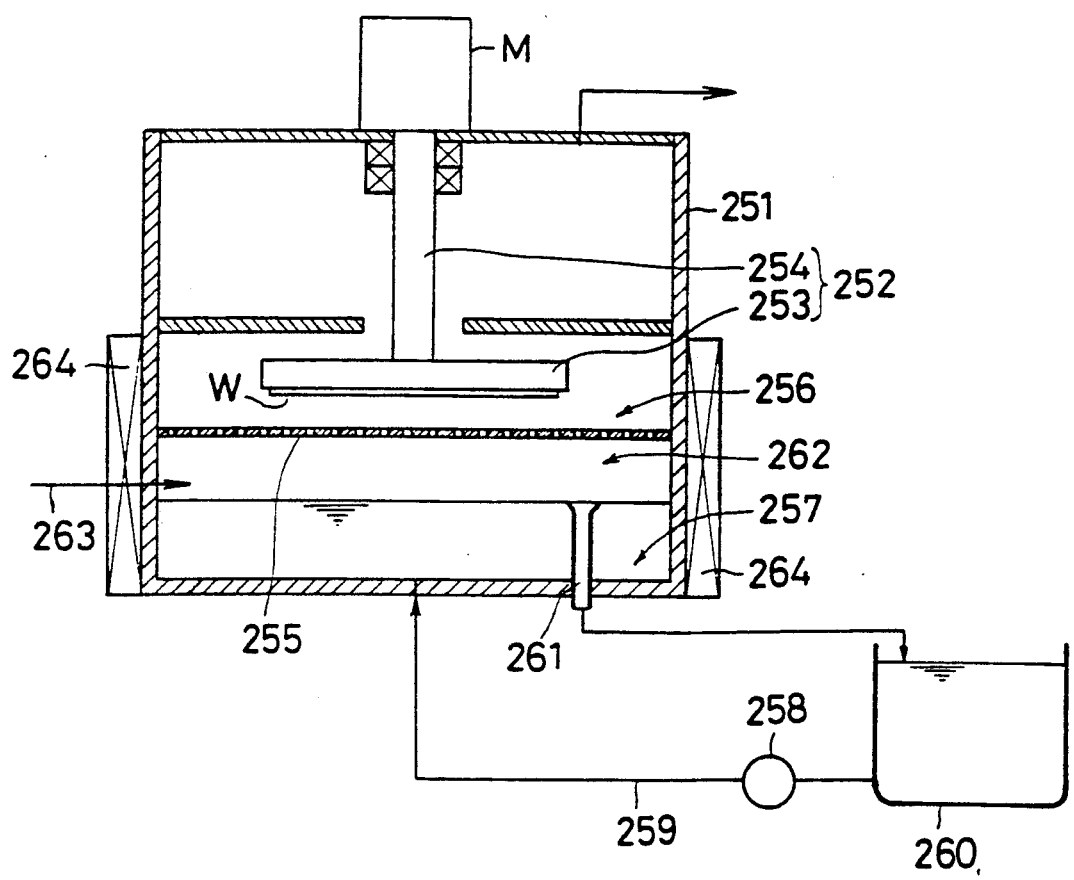
FIG. 14 is a schematic view in vertical section of a wafer cleaning apparatus in a fifth embodiment of the invention.

FIG. 14 is a sectional view of a fifth embodiment which comprises a wafer supporting device 252 mounted in a housing 251 for holding wafer W by vacuum suction.

The wafer supporting device 252 includes a hot plate 253, and a support shaft 254 extending upwardly rom the hot plate 253 and supported by the housing 251 to be rotatable on a vertical axis. An electric motor M is connected to an upper end of the support shaft 254.

A vapor supply section 256 including a porous plate 255 is disposed under a wafer holding position of the hot plate 253.

The housing 251 defines a hydrofluoric acid tank 257 in a bottom portion thereof for storing a cleaning solution. A hydrofluoric acid strorage tank 260 is connected to this hydrofluoric acid tank 257 through a supply pipe 259 including a pump 258. The hydrofluoric acid tank 257 includes an overflow pipe 261 so that a proper amount of hydrofluoric acid is stored in the hydrofluoric acid tank 257 at initial and replenishing times.

A vapor generating region 262 is defined between an upper surface of the hydrofluoric acid tank 257 and porpous plate 255. A mixing gas supply pipe 263 communicates with the vapor generating region 204 for supplying nitrogen gas $N_2$ as a carrier gas and mixing gas.

A heater 264 surrounds the housing 251 over a range including the wafer holding position of hot plate 253, vapor supply section 256, vapor generating region 262 and hydrofluoric acid tank 257. The heater 264 acts to maintain hydrofluoric acid in the tank 257 at a temperature below the boiling point and, in combination with the heating action of hot plate 253, maintains the vapor of hydrofluoric acid in the vapor generating region 262 to a temperature above the dew point.

The fourth and fifth embodiments may include the ultraviolet/ozone cleaning chamber described in the third embodiment for eliminating organic contamination from the wafer W.

While, in the foregoing embodiments, the wafer W is spun during the cleaning treatment, the present invention may be embodied as an apparatus in which the wafer W is not spun while being cleaned.

In all of the embodiments described herein, cleaning vapor is produced by heating the cleaning solution. Where a cleaning solution having a boiling point below room temperature is employed, a similar treatment can be effected by cooling the cleaning solution.

Although the present invention has been described and illustrated in detail, it is clearly understood that the same is by way of illustration and example only and is not be be taken by way of limitation, the spirit and scope of the present invention being limited only by the terms of the appended claims.

What is claimed is:

1. A wafer cleaning apparatus having a wafer supporting device for supporting a wafer under treatment, comprising;
    a cleaning solution storage for storing a cleaning solution,
    a vapor generating section defined above, said cleaning solution storage including means for evaporating said cleaning solution at a temperature below a boiling point thereof, and
    a vapor supply section including means for supplying cleaning vapor to said wafer supported by said wafer supporting device while adjusting the cleaning vapor to a temperature above a dew point thereof, wherein said cleaning solution storage, said vapor generating section, a wafer supporting position of said wafer supporting device and said vapor supply section are arranged in a housing to overlap one another in plan view and to lie vertically close to one another.

2. A wafer cleaning apparatus as claimed in claim 1, wherein at least said wafer supporting position of said wafer supporting device and said vapor supply section are enclosed in a double, inner and outer housing structure, exhaust control means being provided for controlling displacements such that a greater amount of gas is exhausted from an inner housing than from a space between said inner housing and an outer housing.

3. A wafer cleaning apparatus having a wafer supporting device for supporting a wafer under treatment, and a vapor supply section for supplying cleaning vapor to the wafer supported by the wafer supporting means, said apparatus comprising;
   a vapor generating section for evaporating a cleaning solution at a temperature below a boiling point thereof,
   a dry cleaning chamber including temperature control means for adjusting cleaning vapor supplied from said vapor generating section to a temperature above a dew point thereof, said dry cleaning chamber being operable to clean said wafer as placed therein with the cleaning vapor having the adjusted temperature,
   a wafer transport mechanism for transporting the wafer after being cleaned from said dry cleaning chamber, and
   a wet cleaning chamber separated from said dry cleaning chamber and including means for supplying a further cleaning solution, said wet cleaning chamber receiving the wafer transported by said wafer transport mechanism to clean the wafer by supplying said further cleaning solution thereto.

4. A wafer cleaning apparatus as claimed in any one of claims 1 to 3, further comprising an ultraviolet/ozone cleaning chamber including wafer support means for supporting the wafer under treatment, ultraviolet radiator means for directing ultraviolet radiation to the wafer supported by said wafer support means, and ozone supply means for supplying ozone to the wafer supported by said wafer support means, and a wafer transport mechanism for transporting the wafer treated in said ultraviolet/ozone cleaning chamber to said vapor supply section.

5. A wafer cleaning apparatus comprising:
   a housing;
   means for supporting a wafer being treated at a prescribed level;
   storing means for storing a cleaning solution;
   a vapor generating section, defined above said storing means, for evaporating said cleaning solution at a temperature below a boiling point thereof into cleaning vapor; and
   a vapor supply section including means for supplying said cleaning vapor to said wafer supported by said supporting means while adjusting said cleaning vapor to a temperature above a dew point thereof so as to reduce formation of an aerosol as a result of condensation of said cleaning vapor;
   said vapor generating section, said storing means, said vapor supply section, and said prescribed level of said supporting means being so provided in said housing as to overlap one another in plan view and to be positioned vertically downwardly adjacent to one another in this order.

* * * * *